(12) United States Patent
Hirota et al.

(10) Patent No.: US 12,368,031 B2
(45) Date of Patent: Jul. 22, 2025

(54) PLASMA PROCESSING METHOD

(71) Applicant: Hitachi High-Tech Corporation, Tokyo (JP)

(72) Inventors: Kosa Hirota, Tokyo (JP); Masahiro Sumiya, Tokyo (JP); Koichi Nakaune, Tokyo (JP); Nanako Tamari, Tokyo (JP); Satomi Inoue, Tokyo (JP); Shigeru Nakamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 14 days.

(21) Appl. No.: 17/736,214

(22) Filed: May 4, 2022

(65) Prior Publication Data
US 2022/0262606 A1 Aug. 18, 2022

Related U.S. Application Data

(62) Division of application No. 16/084,095, filed as application No. PCT/JP2018/010697 on Mar. 19, 2018, now Pat. No. 11,355,324.

(30) Foreign Application Priority Data

Mar. 27, 2017 (JP) .................................. 2017-060353

(51) Int. Cl.
*H01J 37/32* (2006.01)
*C23C 16/44* (2006.01)
(Continued)

(52) U.S. Cl.
CPC .... *H01J 37/32862* (2013.01); *C23C 16/4405* (2013.01); *H01J 37/32963* (2013.01);
(Continued)

(58) Field of Classification Search
CPC .......... C23C 16/4405; H01J 2237/3341; H01J 37/32862; H01J 37/32963; H01L 21/3065;
(Continued)

(56) References Cited

U.S. PATENT DOCUMENTS 7,204,913 B1 4/2007 Singh et al.
7,767,584 B1 8/2010 Singh et al.
(Continued)

FOREIGN PATENT DOCUMENTS

JP H09-171999 A 6/1997
JP H11-40502 A 2/1999
(Continued)

OTHER PUBLICATIONS

Office Action mailed Jul. 22, 2022 in Taiwanese Application No. 110102223.
(Continued)

*Primary Examiner* — Douglas Lee
(74) *Attorney, Agent, or Firm* — Miles & Stockbridge, P.C.

(57) ABSTRACT

An object of the present invention is to provide a plasma processing method capable of removing complex depositions of metal and non-metal deposited in a processing chamber by etching processing of a wafer to reduce generation of particle due to the depositions, in a plasma processing method for plasma-etching the wafer such as a semiconductor substrate.

According to the present invention, there is provided a plasma processing method for plasma-etching a sample in a processing chamber and plasma-cleaning the inside of the processing chamber, the method comprising: an etching step for plasma-etching a predetermined number of the samples; a metal removing step of removing a deposited film con-
(Continued)

taining a metal element by using a plasma after the etching step; and a non-metal removing step of removing the deposited film containing the non-metal element by using a plasma different from the plasma in the metal removing step, in which the metal removing step and the non-metal removing step are repeated twice or more.

1 Claim, 18 Drawing Sheets

(51) Int. Cl.
    *H01L 21/3065*     (2006.01)
    *H01L 21/311*     (2006.01)
    *H01L 21/3213*     (2006.01)
    *H01L 21/66*     (2006.01)
    *H01L 21/67*     (2006.01)

(52) U.S. Cl.
    CPC .... *H01L 21/3065* (2013.01); *H01L 21/31116* (2013.01); *H01L 21/32136* (2013.01); *H01L 21/67069* (2013.01); *H01L 22/26* (2013.01); *H01J 2237/3341* (2013.01)

(58) Field of Classification Search
    CPC ......... H01L 21/31116; H01L 21/32136; H01L 21/67069; H01L 22/26; H05H 1/46
    See application file for complete search history.

(56) References Cited

U.S. PATENT DOCUMENTS

| | | | |
|---|---|---|---|
| 8,557,709 | B2 | 10/2013 | Sumiya et al. |
| 8,767,166 | B2 | 7/2014 | Kubota et al. |
| 10,923,360 | B2 | 2/2021 | Katsunuma |
| 11,664,236 | B2 | 5/2023 | Katsunuma |
| 2004/0014327 | A1 | 1/2004 | Ji et al. |
| 2005/0118809 | A1 | 6/2005 | Noguchi et al. |
| 2005/0215062 | A1 | 9/2005 | Miyagawa et al. |
| 2006/0275931 | A1 | 12/2006 | Takizawa et al. |
| 2007/0004189 | A1 | 1/2007 | Noguchi et al. |
| 2009/0277872 | A1 | 11/2009 | Yamamoto et al. |
| 2010/0159704 | A1 | 6/2010 | Hirota et al. |
| 2011/0114130 | A1 | 5/2011 | Kang et al. |
| 2011/0226734 | A1 | 9/2011 | Sumiya et al. |
| 2012/0085366 | A1 | 4/2012 | Hirota |
| 2013/0084707 | A1 | 4/2013 | Hashimoto et al. |
| 2013/0087174 | A1 | 4/2013 | Sun et al. |
| 2014/0053983 | A1* | 2/2014 | Sumiya ............. H01J 37/32192 156/345.33 |
| 2014/0166049 | A1 | 6/2014 | Kang et al. |
| 2014/0373867 | A1 | 12/2014 | Harada |
| 2015/0000695 | A1 | 1/2015 | Noda et al. |
| 2015/0024599 | A1 | 1/2015 | Sumiya et al. |
| 2016/0217978 | A1* | 7/2016 | Mai ................... H01J 37/32669 |
| 2016/0379833 | A1 | 12/2016 | Hong et al. |
| 2017/0032955 | A1* | 2/2017 | Sumiya ............... H01L 21/0206 |
| 2017/0040147 | A1 | 2/2017 | Shih et al. |
| 2017/0194561 | A1 | 7/2017 | Suyama et al. |
| 2018/0082855 | A1* | 3/2018 | Sasaki ............... H01L 21/67069 |
| 2019/0362984 | A1 | 11/2019 | Katsunuma |
| 2021/0143019 | A1 | 5/2021 | Katsunuma |

FOREIGN PATENT DOCUMENTS

| | | |
|---|---|---|
| JP | 2002270589 A | 9/2002 |
| JP | 2005142369 A | 6/2005 |
| JP | 2005-268292 A | 9/2005 |
| JP | 2008-060171 A | 3/2008 |
| JP | 2009016611 A | 1/2009 |
| JP | 2010-153508 A | 7/2010 |
| JP | 2011-192872 A | 9/2011 |
| JP | 2011249405 A | 12/2011 |
| JP | 2012182373 A | 9/2012 |
| JP | 2012222225 A | 11/2012 |
| JP | 5450187 B2 | 3/2014 |
| JP | 2014-528642 A | 10/2014 |
| JP | 2015-008211 A | 1/2015 |
| JP | 5750496 B2 | 7/2015 |
| JP | 2016072264 A | 5/2016 |
| JP | 2017-010972 A | 1/2017 |
| JP | 2018-046216 A | 3/2018 |
| KR | 10-2011-0054287 A | 5/2011 |
| KR | 10-2018-0030742 A | 3/2018 |
| TW | 200402458 A | 2/2004 |
| TW | 201207520 A | 2/2012 |
| TW | 202004911 A | 1/2020 |

OTHER PUBLICATIONS

Office Action mailed Mar. 14, 2022 in Korean Application No. 10-2021-7001574.
Search Report mailed Apr. 14, 2020 in International Application No. PCT/JP2020/005127.
Written Opinion mailed Apr. 14, 2020 in International Application No. PCT/JP2020/005127.
Office Action mailed Jan. 5, 2023 in U.S. Appl. No. 17/278,372.
Search Report mailed Jun. 19, 2018 in International Application No. PCT/JP2018/010697.
Office Action mailed Dec. 19, 2018 in Taiwanese Application No. 107110224.
Office Action mailed Jul. 17, 2020 in Taiwanese Application No. 108126525.
Non Final Office Action mailed Apr. 28, 2021 in U.S. Appl. No. 16/084,095.
Notice of Allowance mailed Feb. 10, 2022 in U.S. Appl. No. 16/084,095.
Office Action mailed Jun. 13, 2023 in Taiwanese Application No. 110102223.
Office Action mailed Oct. 13, 2023 in U.S. Appl. No. 17/278,372.
Office Action mailed Jun. 27, 2023 in Japanese Application No. 2022-145856.
Office Action mailed Jan. 16, 2024 in Japanese Application No. 2022-145856.

* cited by examiner

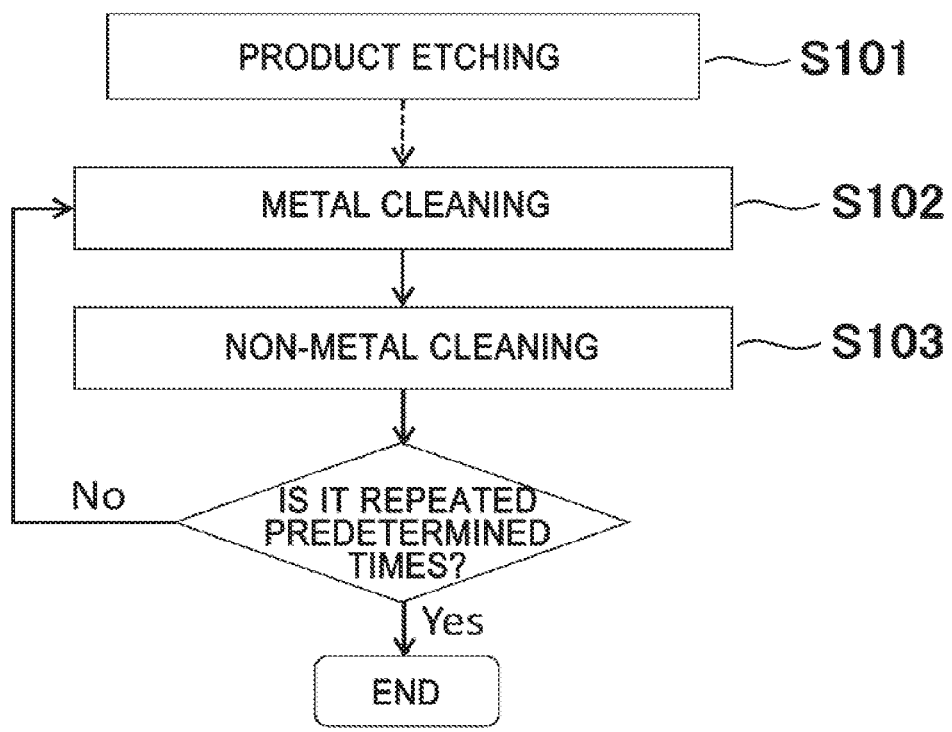
[FIG. 1] (a)
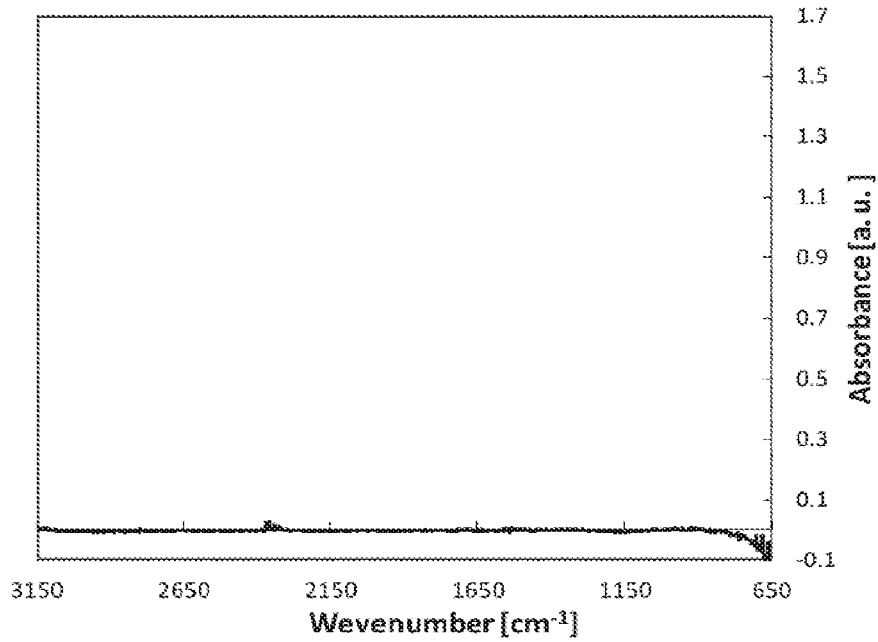
[FIG. 1] (b)

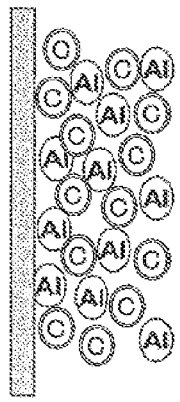
[FIG. 2] (a)
AFTER CLEANING
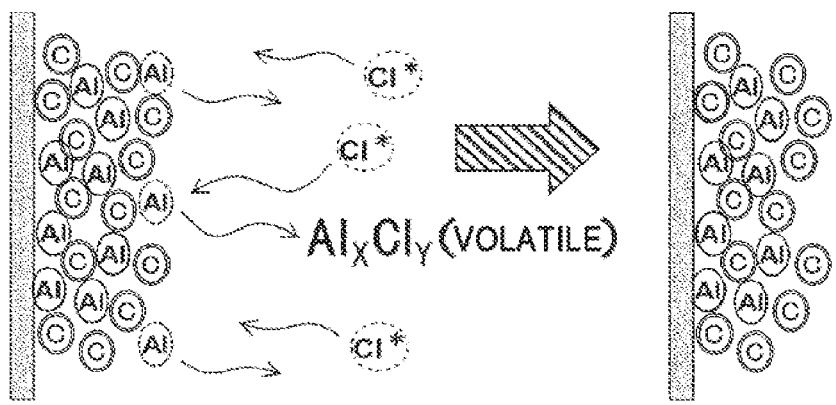
[FIG. 2] (b)
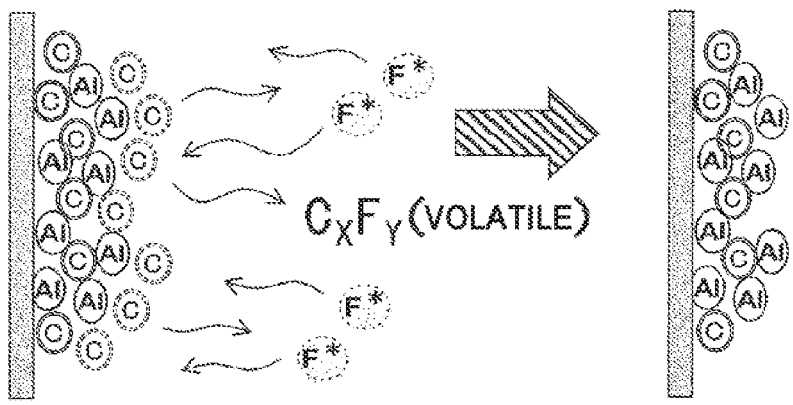
[FIG. 2] (c)

[FIG. 3]
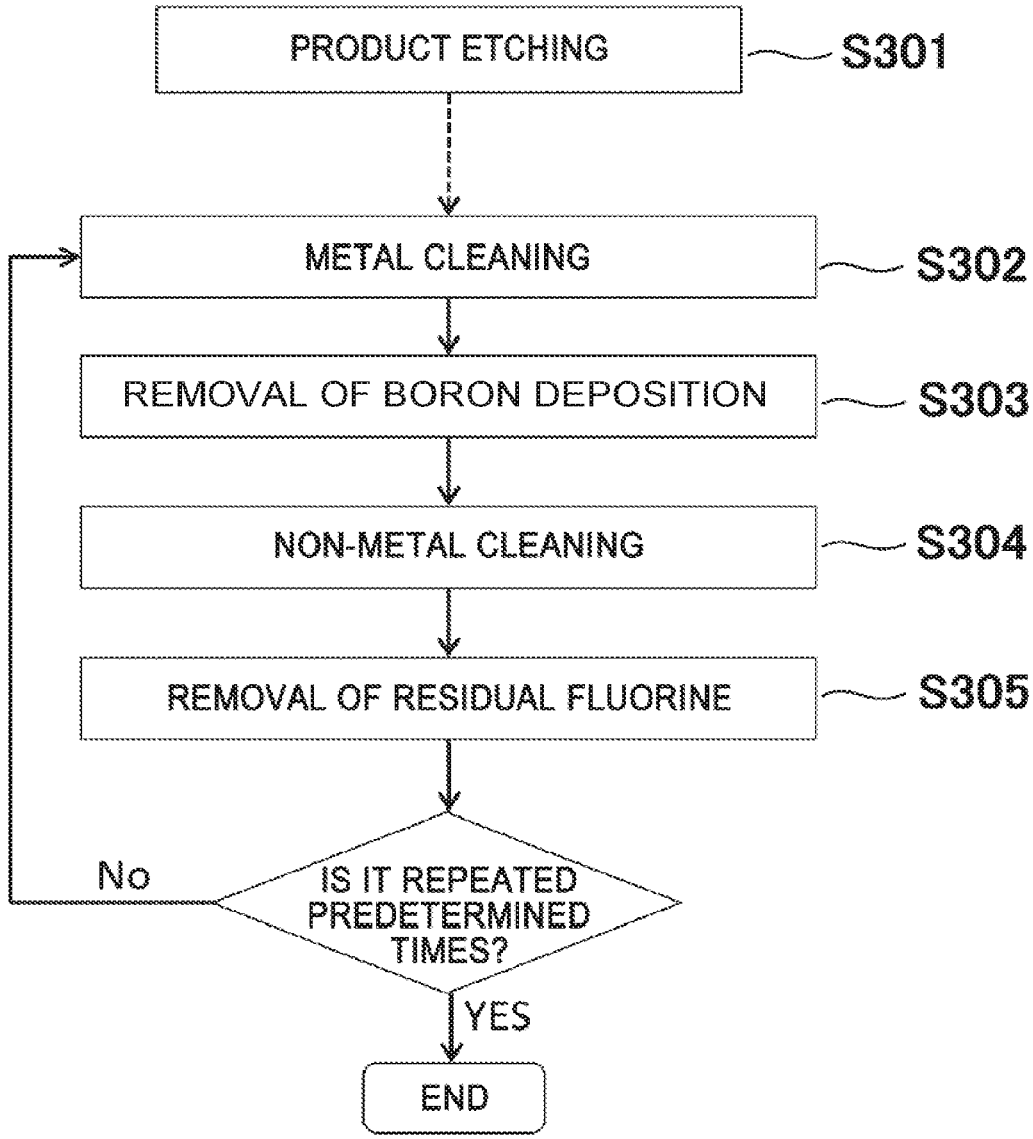

[FIG. 4]
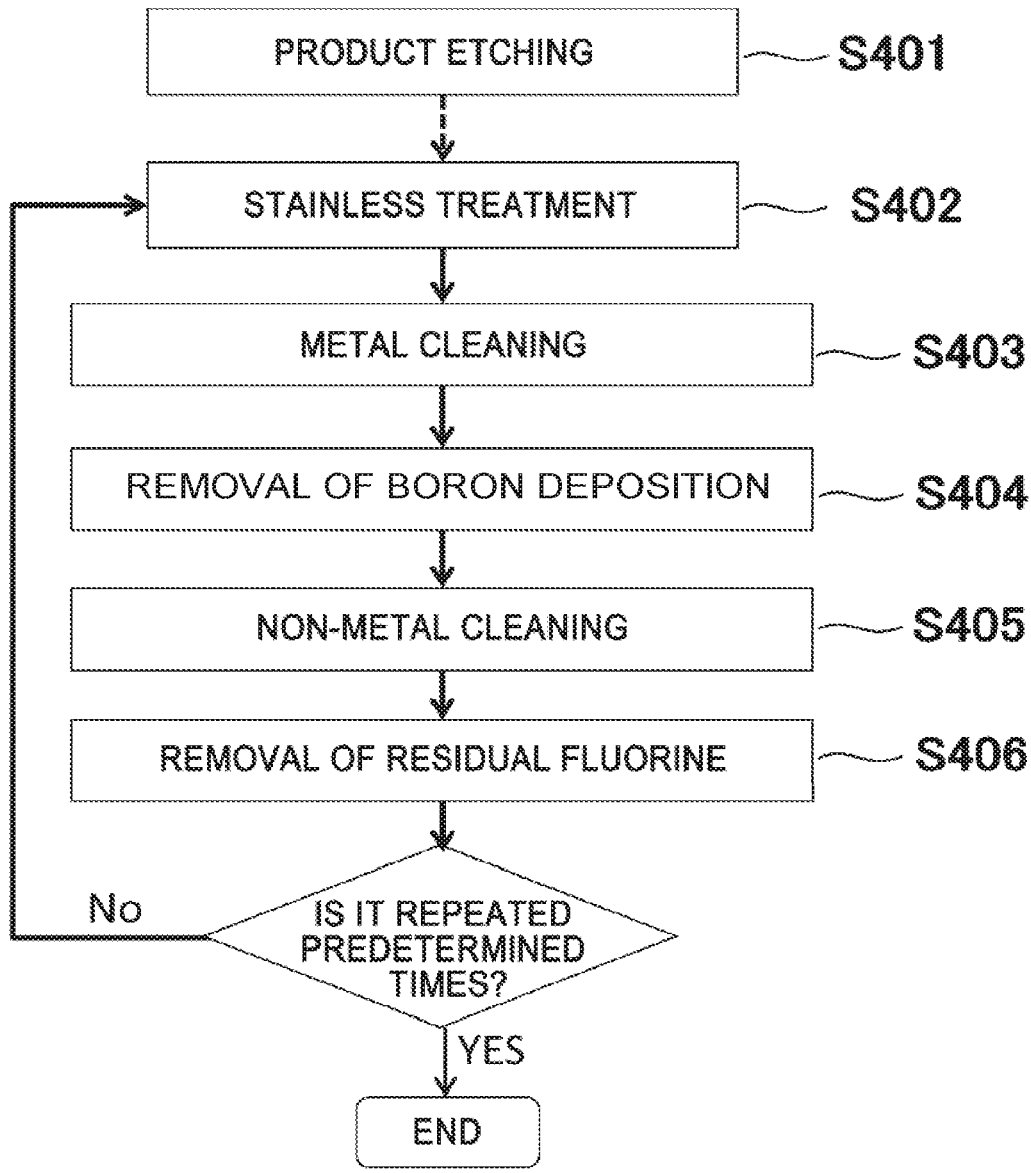

[FIG. 5]
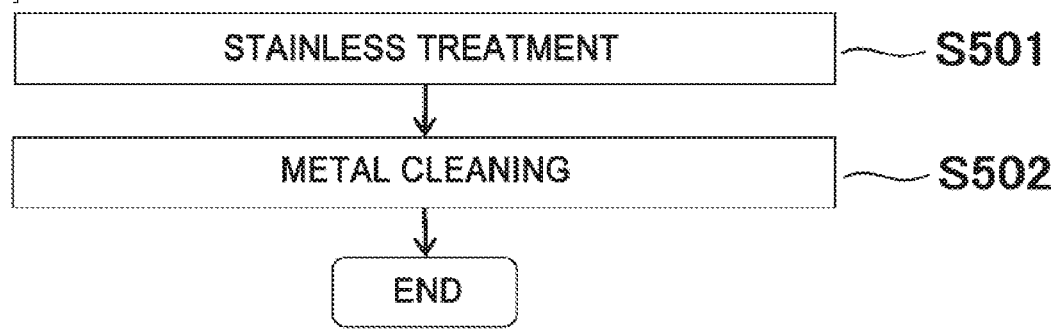
[FIG. 6]
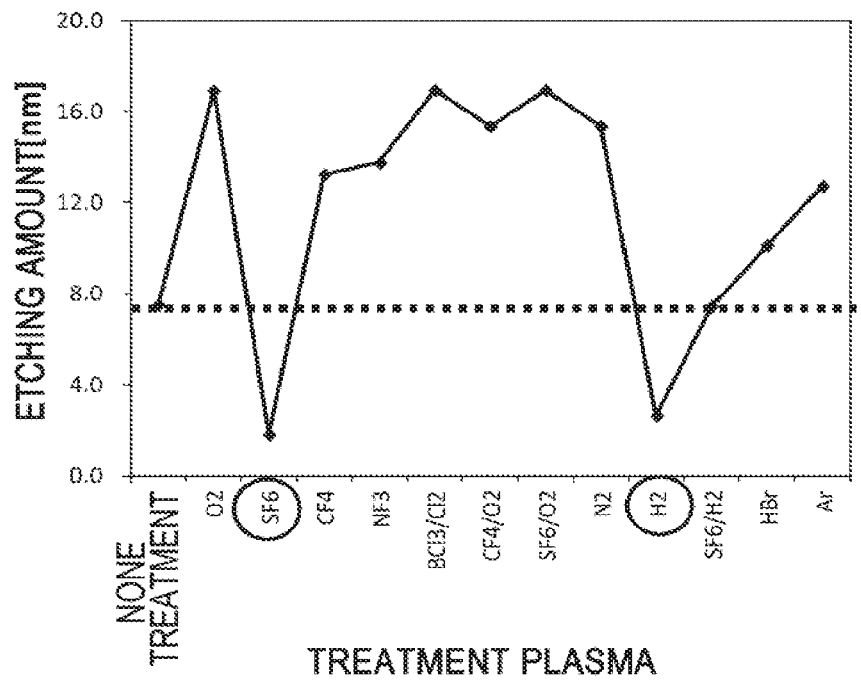

[FIG. 7]
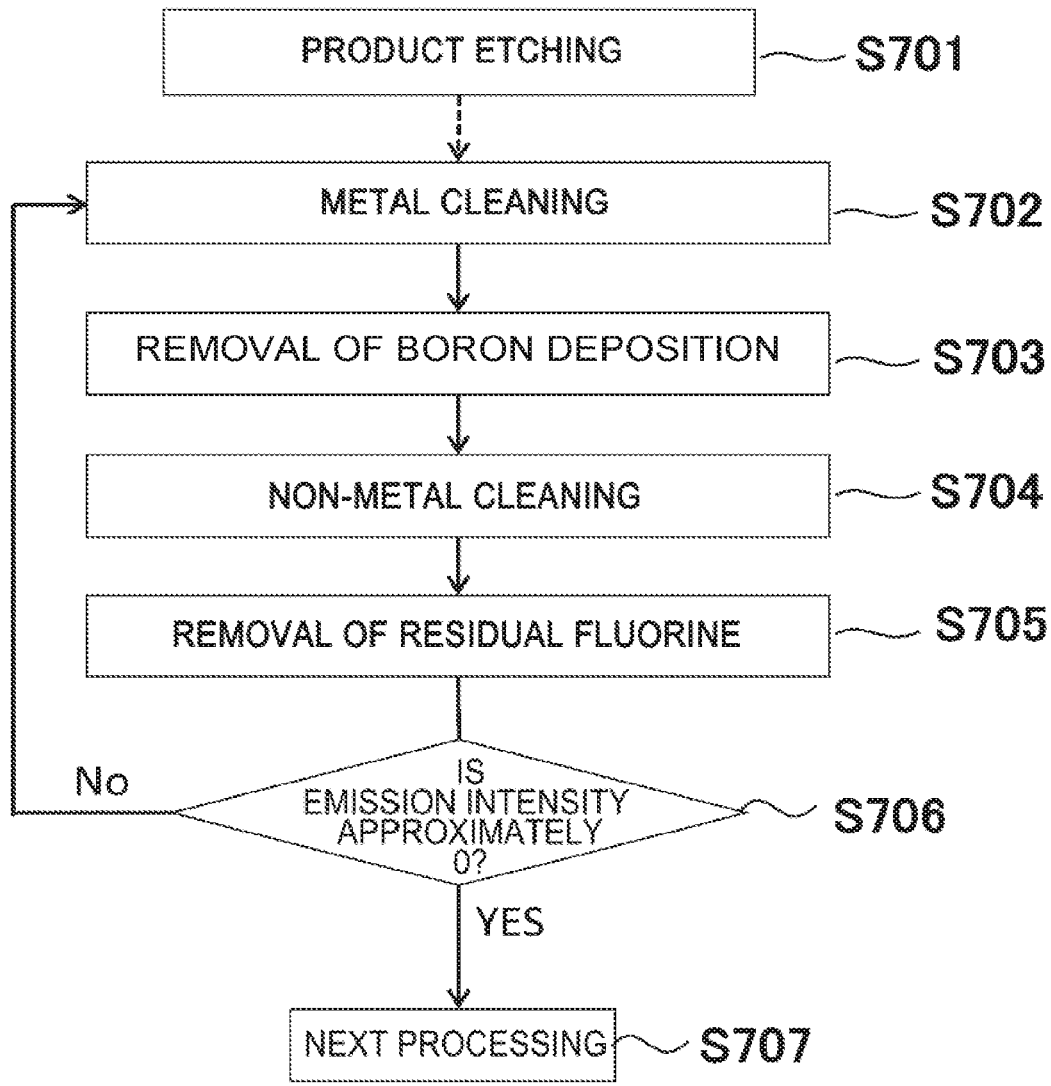

[FIG. 8]
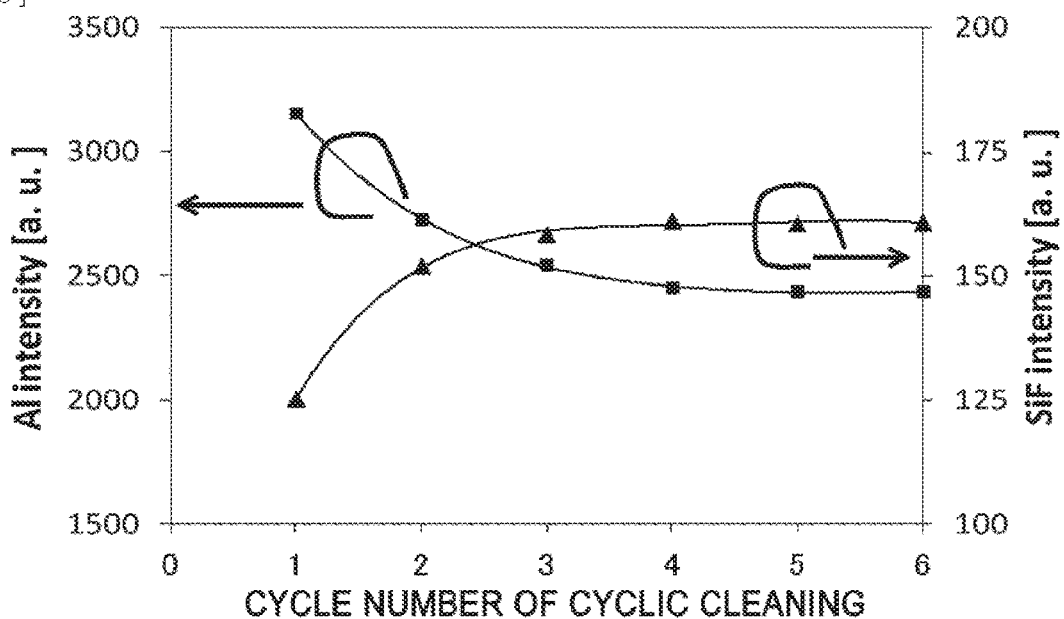
[FIG. 9]
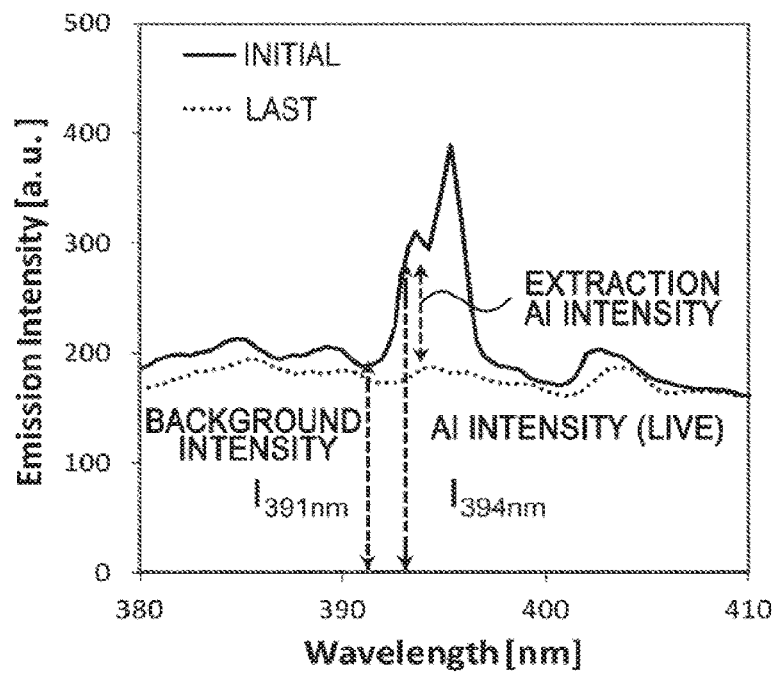

[FIG. 10]
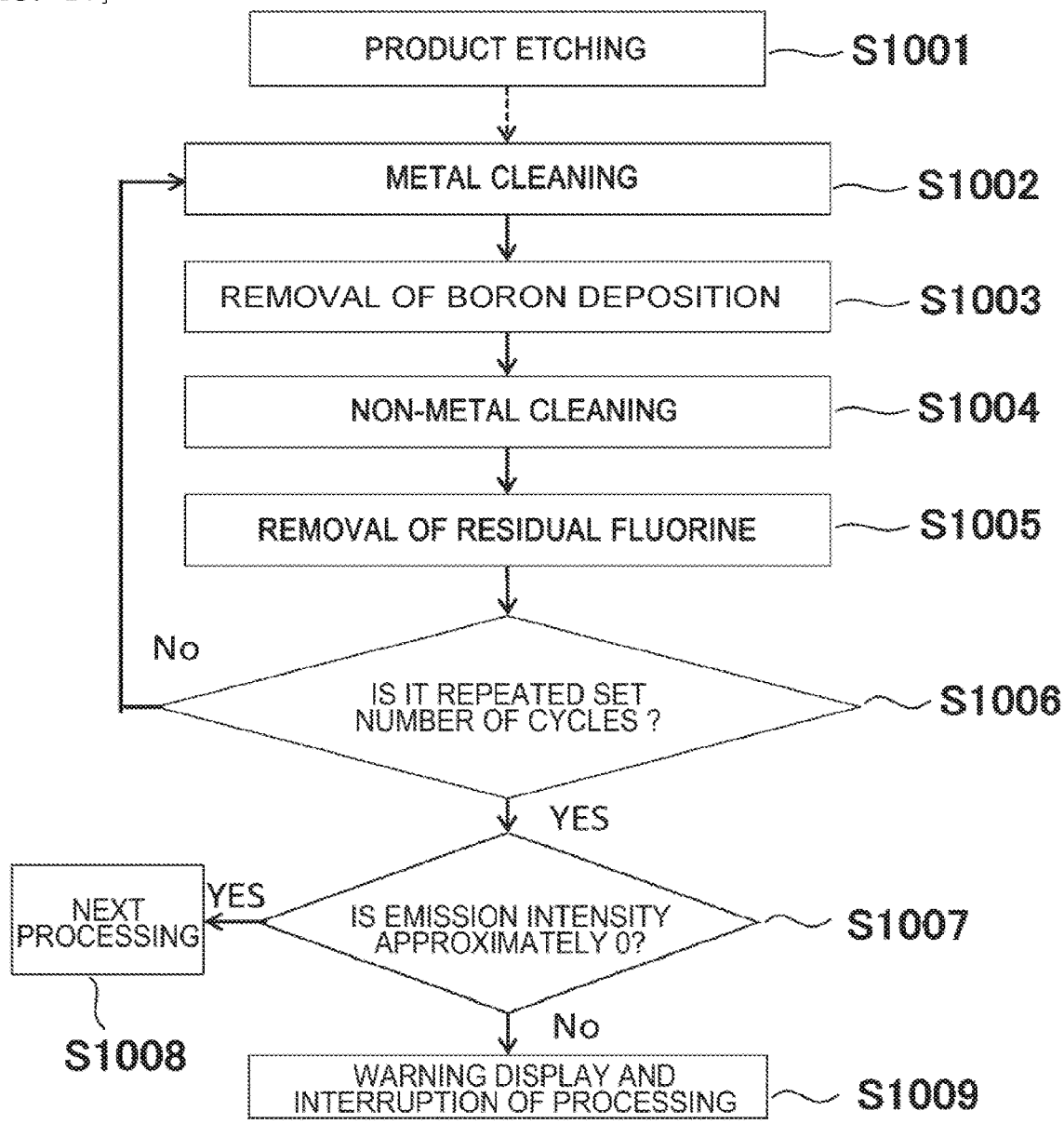

[FIG. 11]
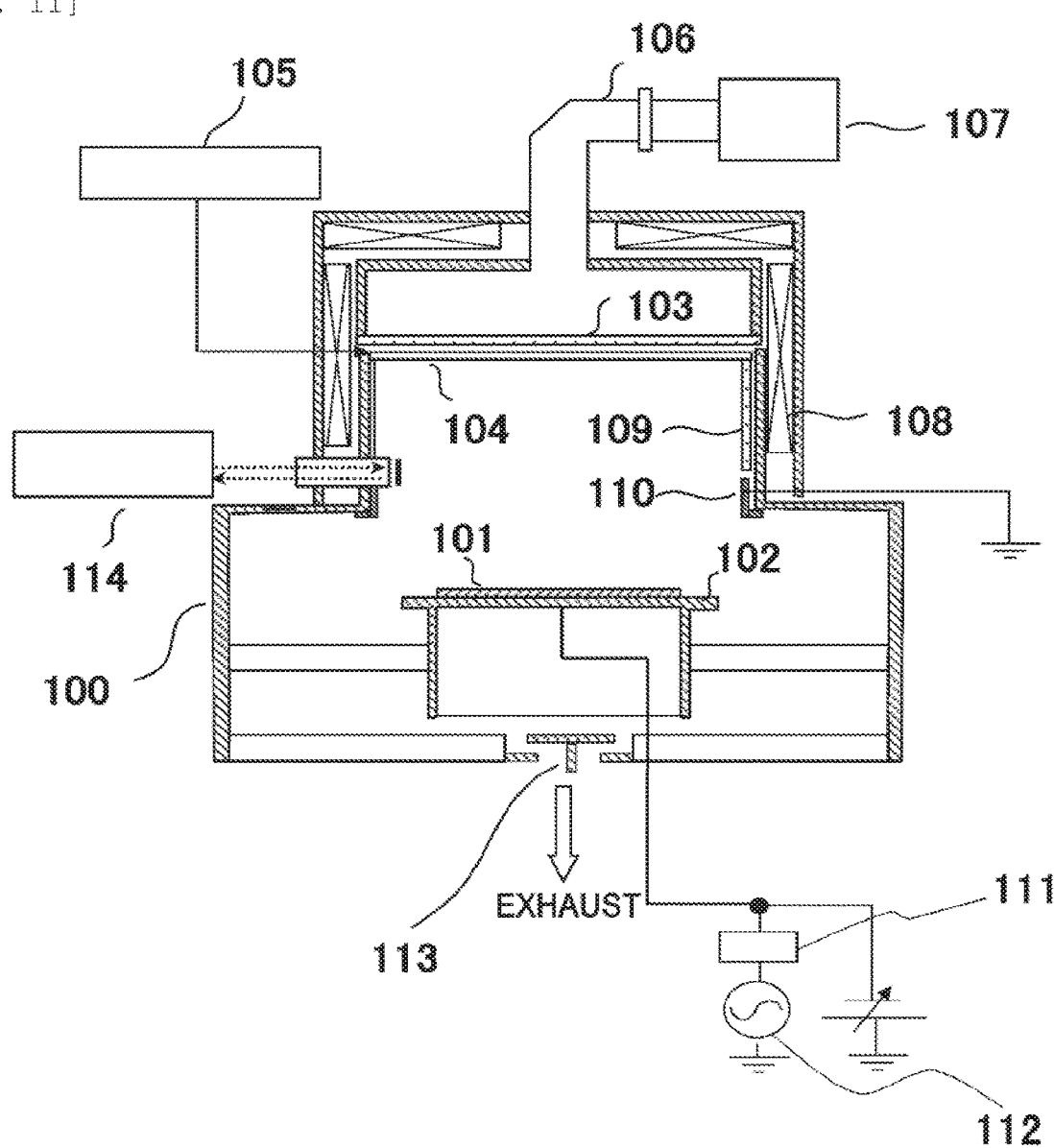

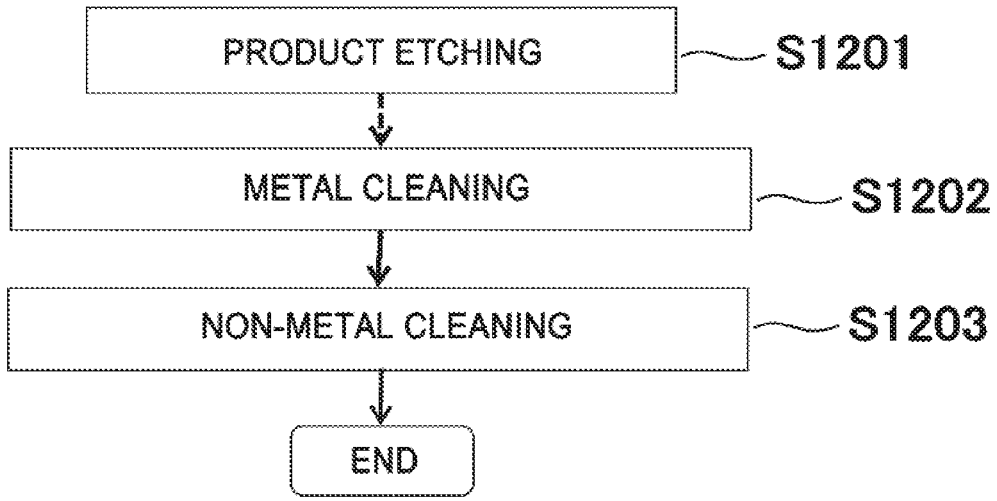
[FIG. 12] (a)
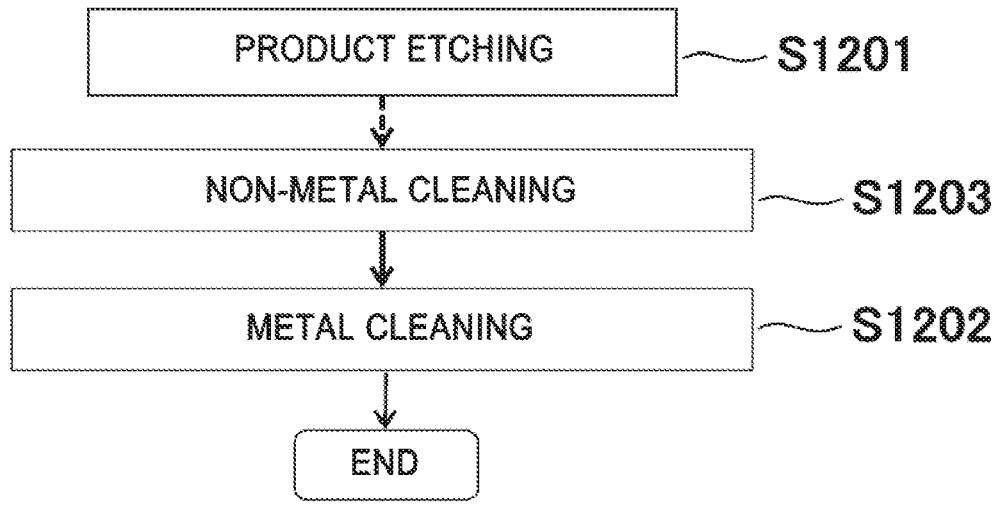
[FIG. 12] (b)

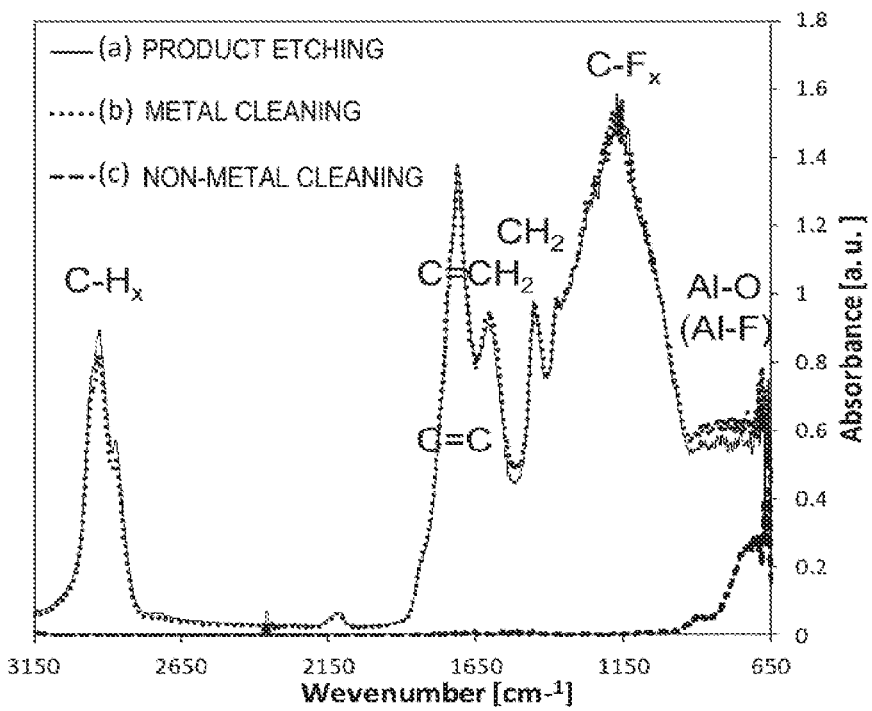
[FIG. 13] (a)
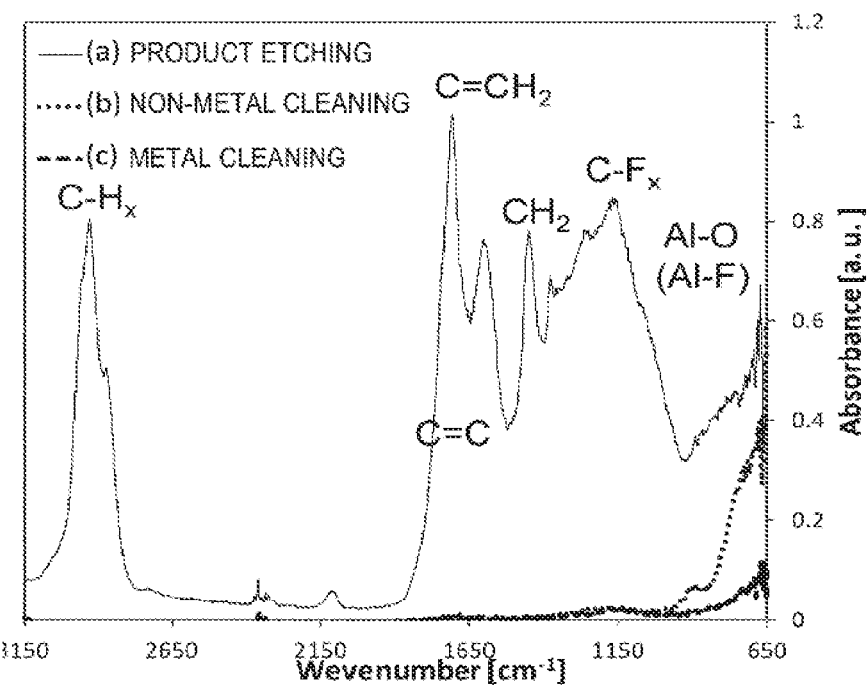
[FIG. 13] (b)

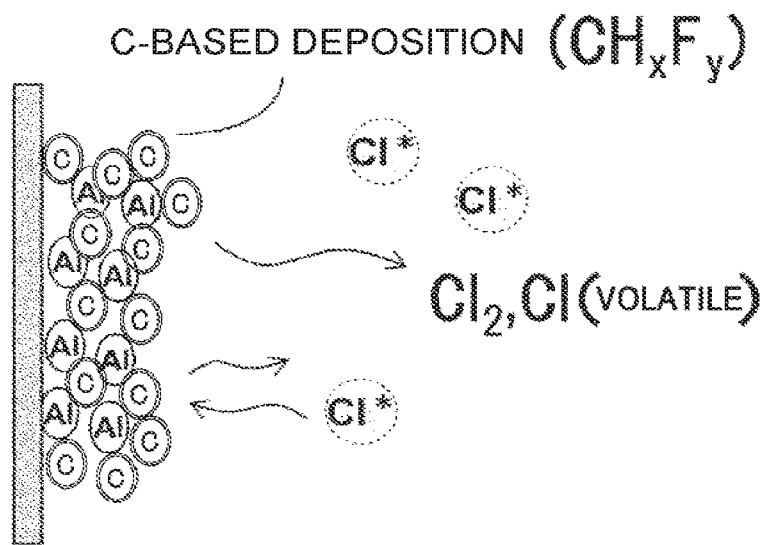
[FIG. 14] (a)
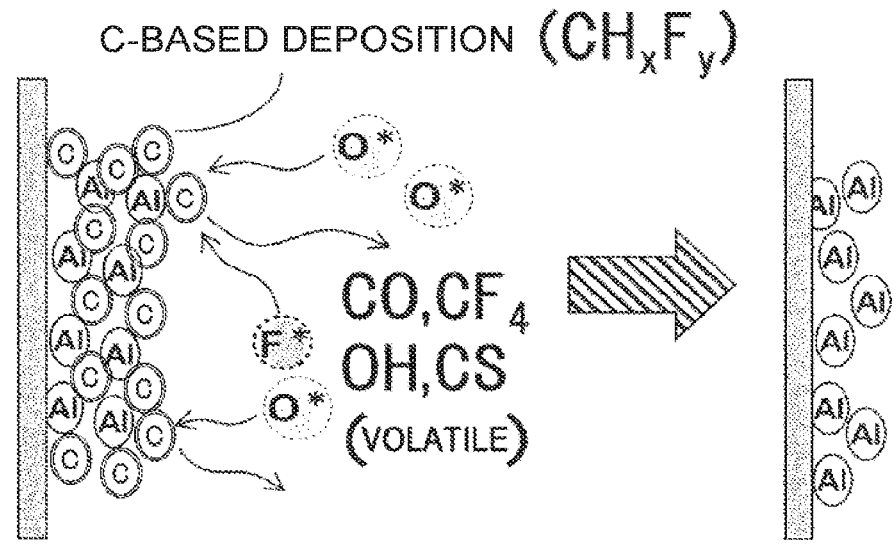
[FIG. 14] (b)

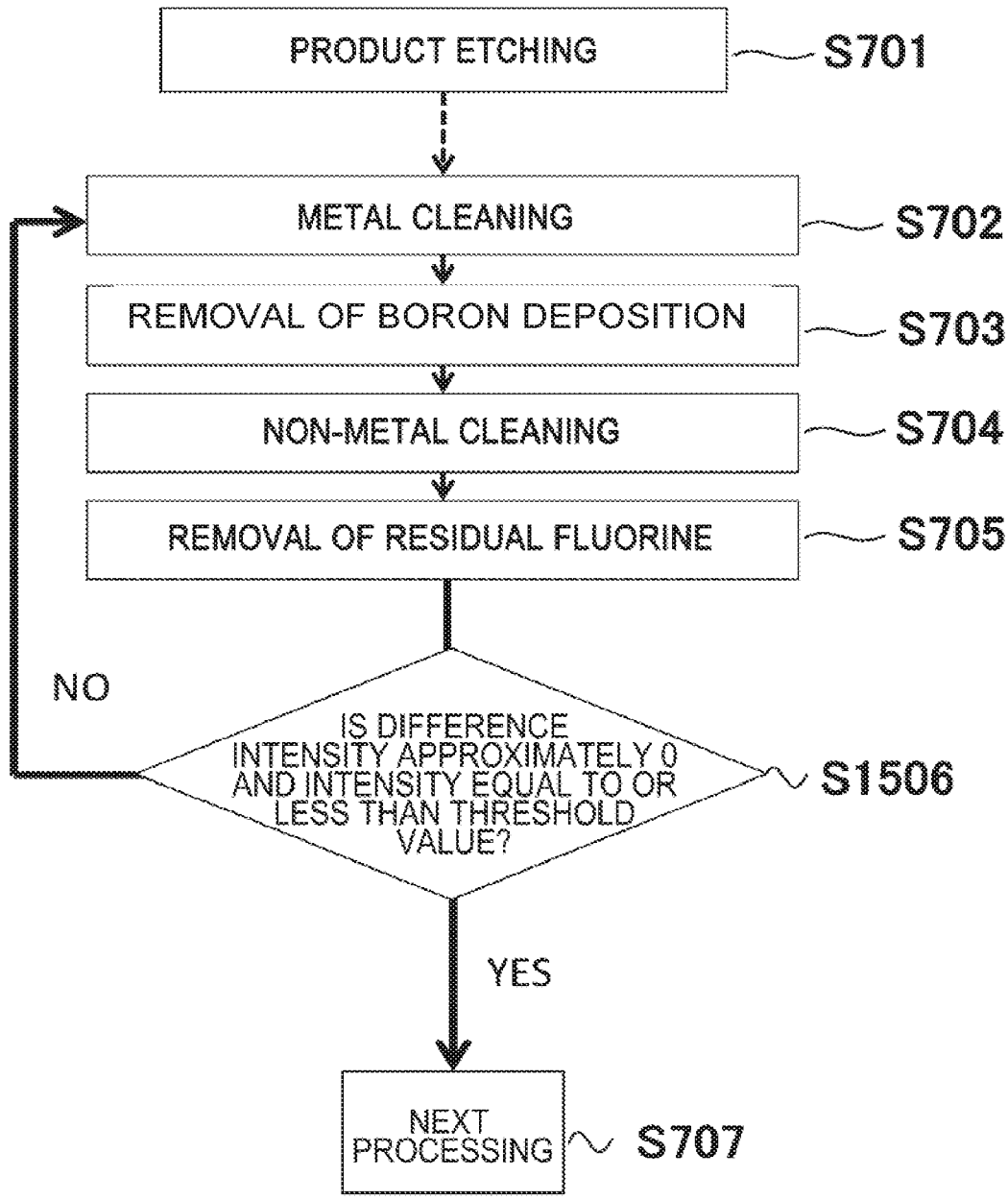
[FIG. 15]

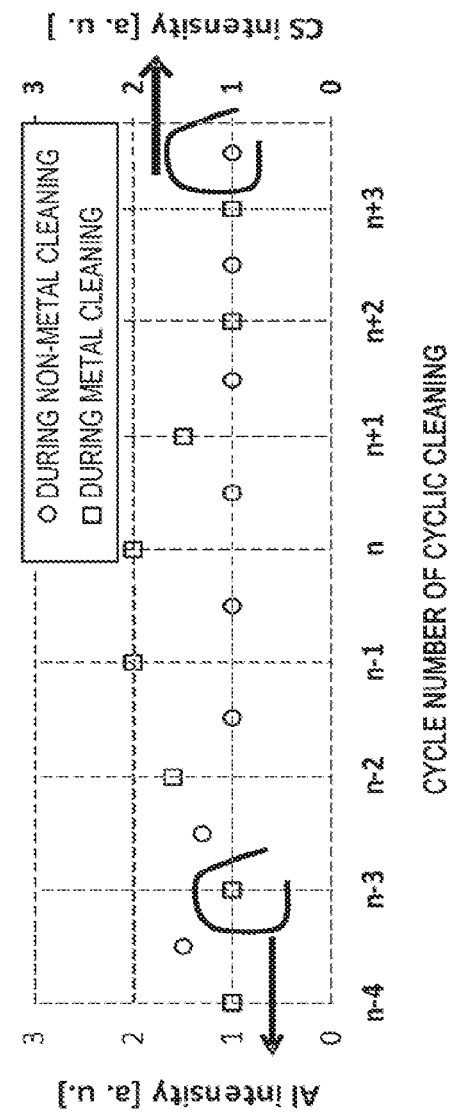
[FIG. 16]

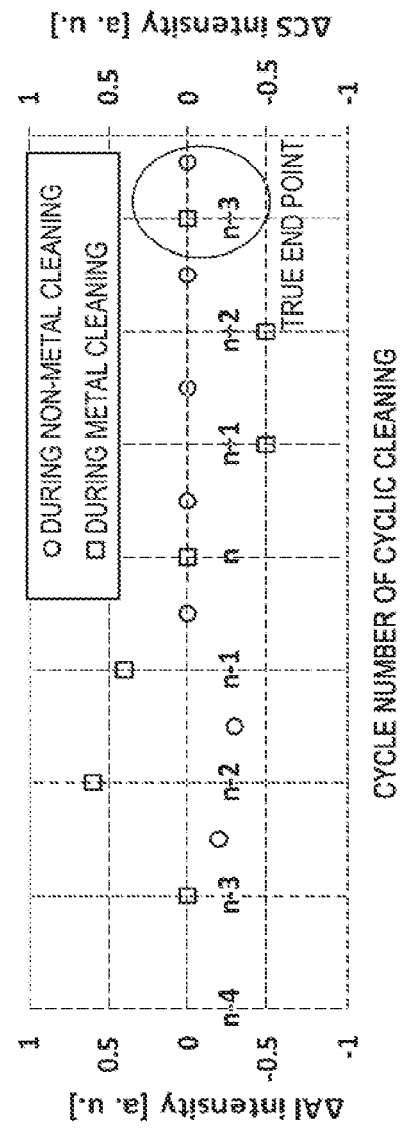
[FIG. 17]

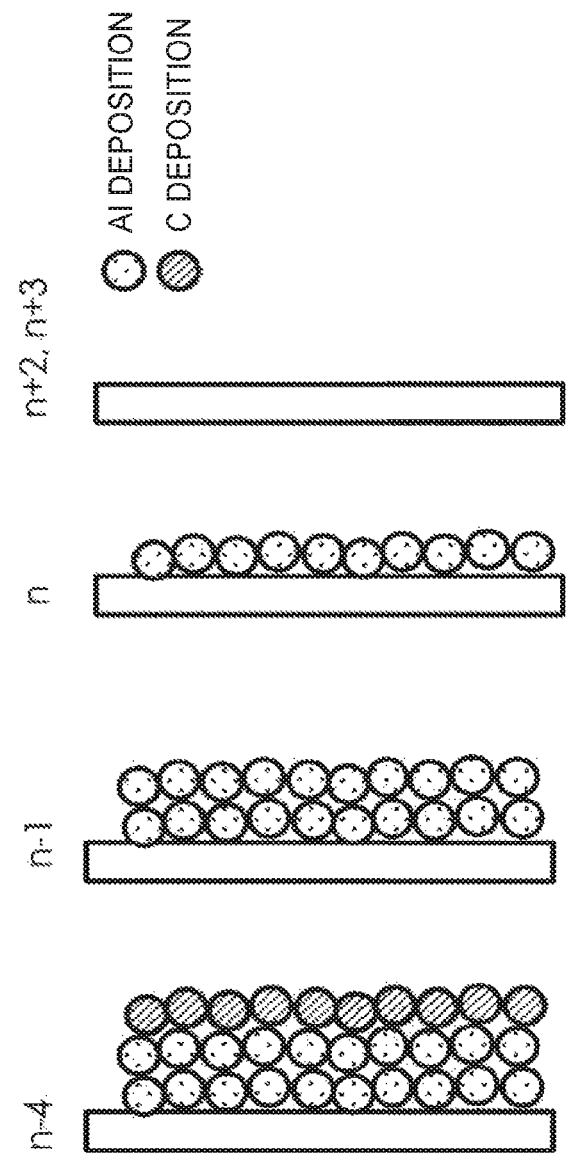
[FIG. 18]

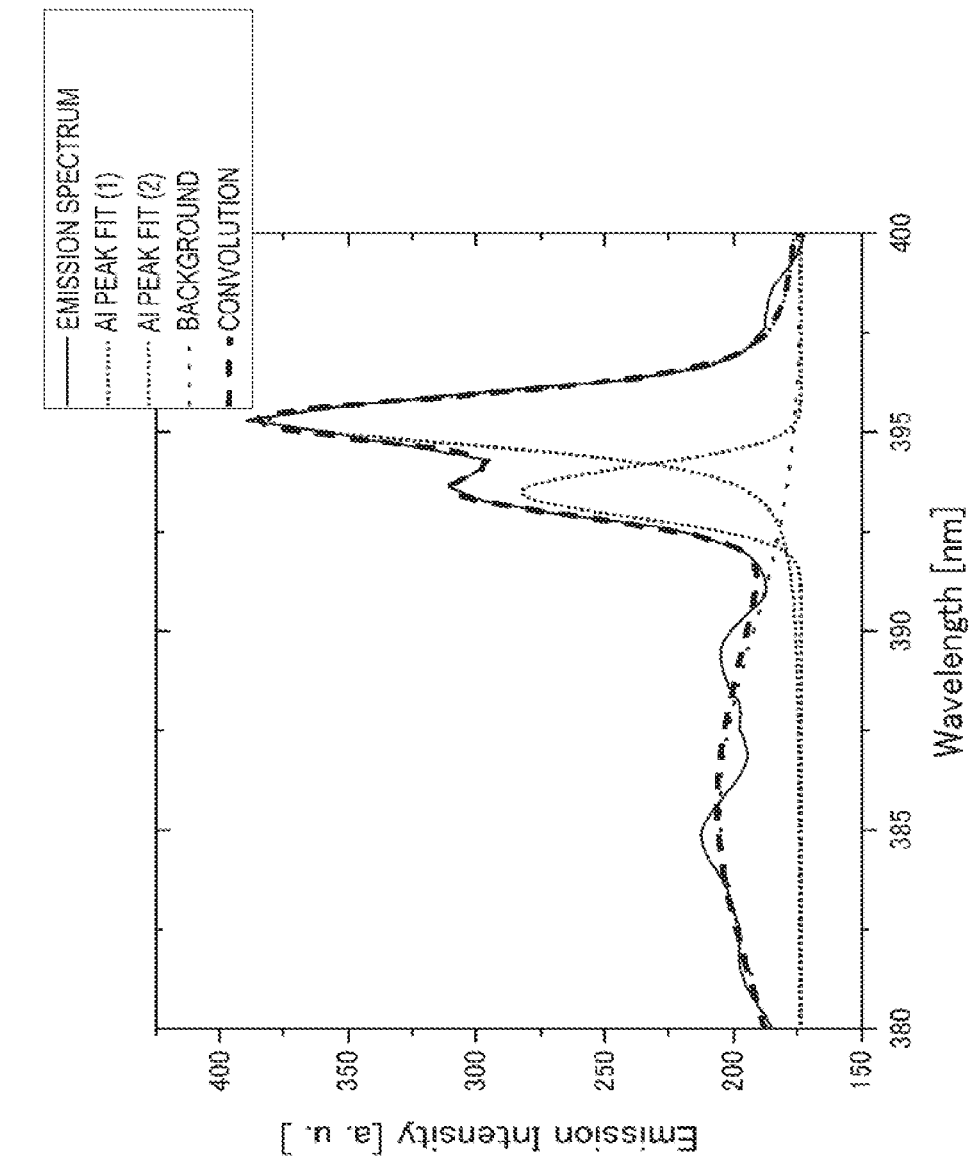
[FIG. 19]

[FIG. 20]
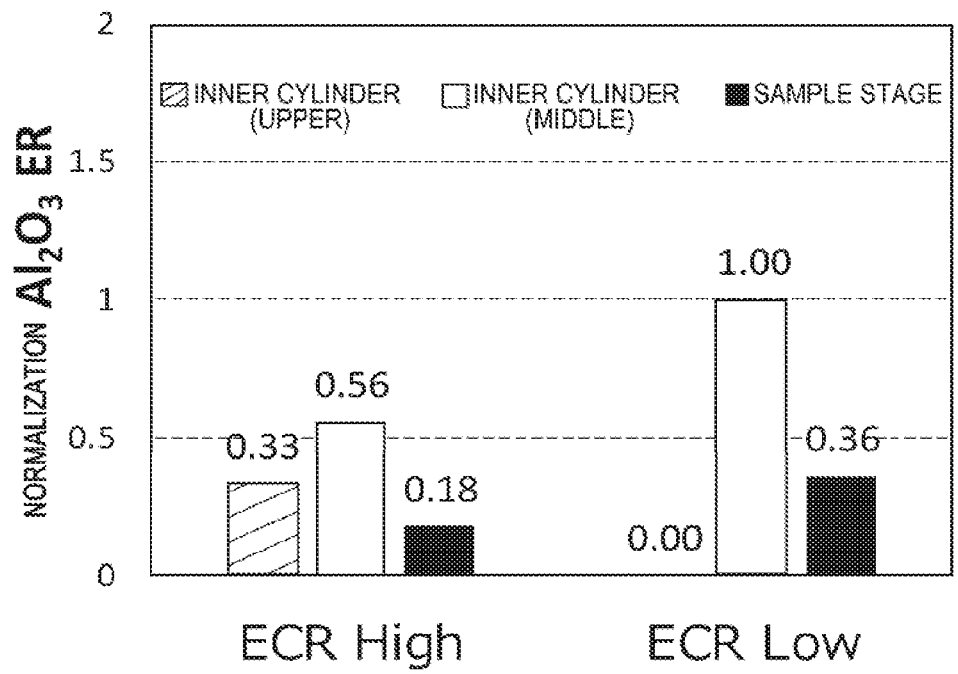
[FIG. 21]
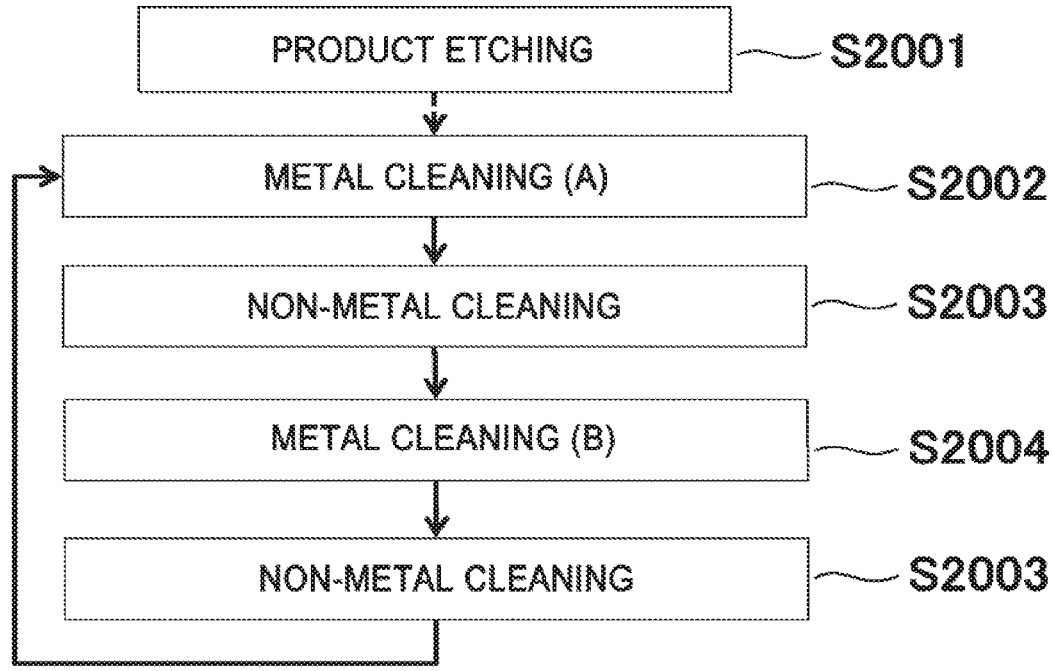

PLASMA PROCESSING METHOD

TECHNICAL FIELD

The present invention relates to a plasma processing method including plasma processing of a sample and plasma cleaning.

BACKGROUND ART

In recent semiconductor devices, transition from a Polysilicon/$SiO_2$ structure of the related art to a High-K/Metal-Gate structure has progressed in order to improve transistor characteristics. In addition, the transition from a planar transistor to a three-dimensional transistor structure is also progressing. For this reason, as the types of materials used for transistors are diversified, the types of depositions (non-volatile materials and volatile materials) on a surface in a processing chamber and a cleaning method thereof have also diversified.

Furthermore, in order to realize the fine structure of the transistor, requests for improvement of etching controllability and selection ratio are increasing. In order to satisfy such a requirement, a mask or spacer made of thin film metal such as TiN or $Al_2O_3$ has been used. For an etching gas, a CF-based gas which is likely to generate depositions on an inner wall of an etching apparatus has been used during an etching process. The deposition in such etching is not a simple monolayer deposition made up of one type of element among Si, C, Ti, Al and Ta, but may be mixed depositions of metal such as Ti, Al and Ta and non-metal such as Si and C in many cases. For this reason, cleaning corresponding to such complicated mixed depositions has become necessary.

In the related art, a processing technique is known for keeping a surface state inside the processing chamber constant by performing plasma cleaning on a deposition generated by wafer processing for each wafer processing or for each lot. For example, PTL 1 discloses a plasma cleaning method by the following procedure in plasma etching of a material to be processed on which a film containing a metal element is disposed. (a) Deposition a film containing a silicon element in a processing chamber in which plasma-etching is performed. (b) After the film containing a silicon element is deposited, the material to be processed is placed on a sample stage disposed in the processing chamber. (c) After placing the material to be processed on the sample stage, the material to be processed is plasma etched. (d) After plasma-etching the material to be processed, a substance containing a metal element in the processing chamber is removed by using plasma. (e) After removing the substance containing a metal element, plasma cleaning is performed on the film containing a silicon element deposited in the processing chamber. The film containing a silicon element in the above (a) is deposited by plasma using a gas containing a silicon element. In this case, the gas containing a silicon element is $SiCl_4$ gas. The removal of the substance containing a metal element in the above (d) is performed using a mixed gas of a $Cl_2$ gas and a $BCl_3$ gas, a mixed gas of a $Cl_2$ gas and a $SiCl_4$ gas, or a mixed gas of a $Cl_2$ gas and an $H_2$ gas. In this case, the plasma cleaning is performed using $NF_3$ gas.

CITATION LIST

Patent Literature

PTL 1: Japanese Patent No. 5750496
PTL 2: JP-A-2005-142369

SUMMARY OF INVENTION

Technical Problem

However, in recent years, in the process in which a deposition (hereinafter also referred to as "mixed deposition") made up of a mixture of metal (for example, Ti, Al, Ta or the like) and non-metal (for example, Si, C or the like) is generated, it is found by the inventors' cleaning evaluation that the above-described plasma cleaning technique in the prior art cannot sufficiently remove the mixed deposition of metal and non-metal. Cleaning evaluation will be described below.

The plasma etching apparatus used for the cleaning evaluation is a microwave ECR (Electron Cyclotron Resonance (ECR) plasma etching apparatus illustrated in FIG. 11. This plasma etching apparatus is configured as follows. A sample stage 102 on which a wafer 101 is placed is provided in a processing chamber 100. A top plate 103 and a shower plate 104 made of quartz are provided on an upper side of the processing chamber 100 so as to face the sample stage 102. A gas supply device 105 is connected to the shower plate 104 portion and the processing gas is supplied into the processing chamber 100 via the shower plate 104.

A waveguide 106 and a radio frequency power supply (microwave source) 107 are provided above the processing chamber 100 via a top plate 103. An electromagnet 108 is wound around the processing chamber 100 and the waveguide 106. By the interaction between the microwave electric field generated from the radio frequency power supply 107 and the magnetic field generated by the electromagnet 108, the processing gas supplied into the processing chamber 100 is turned into plasma. An inner cylinder 109 made of quartz and a ring-shaped earth 110 are provided on an inner wall surface of the processing chamber 100. The inner cylinder 109 protects a side wall of the processing chamber from the plasma generated in the processing chamber 100, and a current due to ions or electrons flows into the earth 110.

Further, a radio frequency power supply 112 for applying a bias is connected to the sample stage 102 via a matching unit 111, and a bias voltage for drawing ions in the plasma onto the wafer 101 is applied to the sample stage 102. A vacuum evacuation device (not illustrated) is connected to the bottom of the processing chamber 100 via a vacuum evacuation valve 113 to maintain and control the inside of the processing chamber 100 to a predetermined pressure. The shower plate 104 and the inner cylinder 109 are electrically floated. In addition, in the present apparatus, Attenuated Total Reflection-Fourier Transfer Infrared Spectroscopy (ATR-FTIR, hereinafter referred to as "FTIR") device 114 capable of detecting depositions on the surface in the processing chamber without opening to the atmosphere is mounted to a side surface portion of the processing chamber 100 in which plasma is formed.

Plasma processing is performed by the apparatus having the above-described configuration, and basic cleaning evaluation of a mixed deposition of metal and non-metal is performed using FTIR device. This evaluation will be described with reference to FIGS. 12(a) and 12(b). FIG.

12(a) illustrates a flow of cleaning evaluation for performing non-metal cleaning after metal cleaning. Further, FIG. 12(b) illustrates a flow of cleaning evaluation for performing metal cleaning after non-metal cleaning.

As illustrated in FIGS. 12(a) and 12(b), first, product etching (S1201) is performed for one lot (25 wafers). In the following description, "product etching" means etching on an actual product wafer or etching on a sample imitating an actual product wafer. As etching conditions, a $CH_3F$ gas having strong carbon deposition properties is used as an etching gas. In addition, a wafer on which $Al_2O_3$ is formed on the entire surface of the wafer is used as an etching evaluation wafer. In this etching, the carbon supplied from the plasmatized etching gas and the mixed deposition of aluminum as the reaction product from the wafer remain in the processing chamber.

In FIG. 12(a), after the product etching (S1201), a metal cleaning (S1202, processing time of 200 seconds) effective for removing Ti, Al, and Ta using a Cl-based gas is performed once. Then, non-metal cleaning (S1203, processing time of 200 seconds) effective for removing Si and C depositions using a mixed gas of a $SF_6$ gas and an $O_2$ gas is performed once.

Meanwhile, in the processing flow of FIG. 12(b), non-metal cleaning (S1203) is performed immediately after etching, the order of metal cleaning (S1202) and non-metal cleaning (S1203) in the processing flow of FIG. 12(a) is reversed.

FIG. 13(a) is an FTIR spectrum after each processing corresponding to the processing flow of FIG. 12(a). After product etching of 25 evaluation wafers (wafers in which $Al_2O_3$ is formed on the entire surface), as illustrated in FIG. 13(a), CC-, CH-, and CF-based peaks over a wide range of wavenumber of 650 $cm^{-1}$ to 3150 $cm^{-1}$ are observed. These peaks are hardly changed even after the execution of the metal cleaning S202 of the processing time of 200 seconds. From this, it can be understood that in the metal cleaning process (S1202), the removal rate of a $CH_xF_y$ film deposited in the process chamber is very slow.

Thereafter, when non-metal cleaning (S1203) is executed, these C-based peaks disappear, while an Al—O (Al—F)-based peak observed in the low wavenumber region of wavenumber of 1000 $cm^{-1}$ or less remains. That is, it is found that Al in a mixed deposition of Al and C is hardly removed in the cleaning flow of FIG. 12(a). In order to remove Al by metal cleaning, it takes several hours or more, and in some cases, Al cannot be removed even by processing for several days or more.

On the other hand, FIG. 13(b) is an FTIR spectrum after each processing corresponding to the flow of FIG. 12(b). As illustrated in FIG. 13(b), the C-based peak disappears by the non-metal cleaning (S1203) immediately after product etching, but the Al—O (Al—F)-based peak observed in the low wavenumber region of wavenumber of 1000 $cm^{-1}$ or less is observed. Thereafter, it is confirmed that Al—O (Al—F) decreases by executing the metal cleaning (S1202).

The phenomenon that the Al—O (Al—F) decreases according to the flow of FIG. 12(b) can be described with reference to FIGS. 14(a) and 14(b).

FIG. 14(a) illustrates an estimated reaction model during metal cleaning immediately after etching. In the case where the metal cleaning is performed on the mixed deposition after the etching prior to the non-metal cleaning, since the C-based deposition blocks the Cl radical in the plasma, the reaction between the Al in the deposition and the Cl radical becomes difficult.

On the other hand, FIG. 14(b) illustrates an estimated reaction model during non-metal cleaning immediately after product etching. As illustrated in FIG. 14(b), when non-metal cleaning is performed immediately after product etching, C-based depositions are removed by O and F radicals, and thus Al is exposed after non-metal cleaning. Al which is not blocked by C reacts with Cl during the next metal cleaning and the reactant is volatilized and exhausted as $AlCl_3$.

However, some of Al is oxidized or fluorinated by O and F radicals during non-metal cleaning to change to reactants which are hardly removed, some Al-based depositions remain even after the metal cleaning, and it is not possible to completely remove the depositions.

In view of the above, an object of the present invention is to provide a plasma processing method capable of removing complex depositions of metal and non-metal deposited in a processing chamber by plasma processing of a wafer to reduce generation of particle due to depositions, in plasma processing of the wafer such as a semiconductor substrate.

Solution to Problem

When cleaning the inside of the processing chamber after the plasma processing, one representative plasma processing method of the present invention is a plasma processing method including: a step for plasma-processing a predetermined number of samples; a metal removing step of removing a deposited film containing a metal element by using plasma after the plasma processing step; and a non-metal removing step of removing the deposited film containing the non-metal element by using plasma different from the plasma in the metal removing step after the etching step and removing the deposited film, in which the metal removing step and the non-metal removing step are repeated twice or more.

Advantageous Effects of Invention

According to the present invention, it is possible to reduce particle (defects) caused by complex depositions of metal and non-metal generated by plasma processing of a wafer.

BRIEF DESCRIPTION OF DRAWINGS

FIG. 1(a) is a flowchart of a plasma process and FIG. 1(b) is a spectrum diagram of FTIR illustrating a first embodiment of a plasma processing method according to the present invention.

FIGS. 2(a) to 2(c) illustrate an estimated reaction model during cleaning in the plasma processing flow illustrated in FIG. 1(a).

FIG. 3 is a flowchart of plasma processing illustrating a second embodiment of the plasma processing method according to the present invention.

FIG. 4 is a flowchart of plasma processing illustrating a third embodiment of the plasma processing method according to the present invention.

FIG. 5 is a flowchart for evaluating stainless steel treatment processing in the plasma processing illustrated in FIG. 4.

FIG. 6 is a view illustrating the evaluation result of the stainless steel treatment processing illustrated in FIG. 5.

FIG. 7 is a flowchart of plasma processing illustrating a fourth embodiment of the plasma processing method according to the present invention.

FIG. 8 is a diagram illustrating cycle number dependence of cyclic cleaning in emission intensity.

FIG. 9 is a diagram illustrating an emission spectrum during metal cleaning in the plasma processing illustrated in FIG. 7.

FIG. 10 is a flowchart of plasma processing illustrating a fifth embodiment of the plasma processing method according to the present invention.

FIG. 11 is a longitudinal sectional view illustrating a plasma etching apparatus used for cleaning evaluation.

FIGS. 12(a) and 12(b) are diagrams illustrating a plasma processing flow used for the cleaning evaluation.

FIGS. 13(a) and 13(b) are diagrams illustrating an FTIR spectrum obtained corresponding to each step of the plasma processing flow illustrated in FIGS. 12(a) and 12(b).

FIGS. 14(a) and 14(b) are diagrams illustrating an estimated reaction model during cleaning in the plasma processing flow illustrated in FIGS. 12(a) and 12(b).

FIG. 15 is a flowchart illustrating an improved end point determination method for cyclic cleaning.

FIG. 16 is a diagram illustrating the relationship between the Al emission intensity and CS emission intensity and the cycle number when cyclic cleaning is executed on mixed depositions in which Al and C are laminated.

FIG. 17 is a diagram illustrating the relationship between the Al difference intensity and CS difference intensity and the cycle number when cyclic cleaning is executed on mixed depositions in which Al and C are laminated.

FIG. 18 is an estimation diagram of a surface state of a processing chamber in each cycle of cyclic cleaning.

FIG. 19 is an example of detection of an Al peak using a Voigt function.

FIG. 20 illustrates an alumina cleaning rate distribution at the time of ECR High and Low setting.

FIG. 21 illustrates an example of a sequence flow of cyclic cleaning using metal cleaning at two upper and lower ECR heights.

DESCRIPTION OF EMBODIMENTS

The present invention alternately repeats cleaning for removing a deposited film containing a metal element generated by plasma processing and cleaning for removing a deposited film containing a non-metal element a plurality of times, and thus a mixed deposition (hereinafter also referred to as "complex deposition") of metal and non-metal is efficiently removed to reduce generation of particle in the processing chamber.

In the embodiments to be described later, the mixed deposition will be described mainly using a case of being generated by etching of a sample. However, the mixed deposition that can be removed by the plasma processing method of the present invention is not limited to depositions generated by etching, and can also be applied to depositions generated by various kinds of processing such as CVD and sputtering.

In the embodiments to be described later, a microwave Electron Cyclotron Resonance (ECR) plasma etching apparatus illustrated in FIG. 11 is used. Hereinafter, a plasma processing method according to the present invention will be described with reference to the drawings.

Further, in the following description, "the surface of the processing chamber" mainly means the surface of the inner surface of the processing chamber.

Embodiment 1

A first embodiment which is a plasma processing method according to the present invention will be described with reference to FIGS. 1(a) and 1(b). FIG. 1(a) illustrates a flow of the plasma processing method according to the present invention. First, in step S101, etching processing of the product wafer as a sample is performed on one lot (25 wafers). Processing of a product wafer is a processing of plasma-etching an interlayer film with a fluorocarbon gas using a thin film metal of $Al_2O_3$ as a mask, as illustrated in PTL 2, for example.

By this etching processing, carbon as a component of the plasmatized processing gas and mixed depositions of aluminum as a reaction product from the wafer remain in the process chamber. FIG. 2(a) illustrates the deposition state of depositions in the processing chamber after etching processing of this product wafer by one lot. For example, on the side wall of the processing chamber, carbon (C) as a deposition and aluminum mixed deposition remain in a state of being mixed.

Next, in step S102, a metal cleaning (hereinafter also referred to as a "metal removing step") for removing metal such as Al which is a deposition residue using a mixed gas of a $BCl_3$ gas and a $Cl_2$ gas as a cleaning gas is performed for 30 seconds. Subsequently, in S103, non-metal cleaning (hereinafter also referred to as "non-metal removing step") for removing Si, C or the like, using a mixed gas of a $SF_6$ gas and an $O_2$ gas is performed for 30 seconds. Thereafter, the metal cleaning (S102) and the non-metal cleaning (S103) are repeated a plurality of times, for example, five times (hereinafter, repeated cleaning of the metal cleaning and the non-metal cleaning is called "cyclic cleaning"). The processing state during the metal cleaning at this time is illustrated in FIG. 2(b), and the processing state during the non-metal cleaning is illustrated in FIG. 2(c).

During the metal cleaning (S102), as illustrated in FIG. 2(b), the Al of the aluminum mixed deposition exposed on the surface of the mixed deposition reacts with the Cl radical from the plasma to form highly volatile $Al_xCl_y$, and the aluminum mixed deposition exposed on the surface is removed. Further, during non-metal cleaning (S103), as illustrated in FIG. 2(c), the aluminum mixed deposition is removed by metal cleaning and carbon (C) exposed on the surface of the mixed deposition reacts with F radicals from the plasma to form highly volatile $C_xF_y$, and C exposed on the surface is removed. As the metal cleaning (S102) and the non-metal cleaning (S103) are alternately repeated, Al and C are alternately exposed on the surface of the mixed deposition and effectively removed, respectively. As a result, the thickness of the mixed deposition becomes gradually thin and the mixed deposition is completely removed.

Incidentally, if the processing time of the non-metal cleaning (S103) is long, C is removed and Al exposed on the surface is fluorinated or oxidized to be converted into a substance with low volatility. For this reason, it is preferable that the supply time of F radicals and O radicals in the non-metal cleaning (S103) is a time to remove C on the surface. In other words, the non-metal cleaning time is set within a range in which metal such as exposed Al does not change to a substance hardly removed. Therefore, it is important to repeatedly perform the cyclic cleaning in the present embodiment while preventing fluorination and oxidation of Al even if C appearing on the surface of the mixed deposition cannot be completely removed. Further, in order to prevent fluorination of Al, it is preferable to perform the metal cleaning (S102) as a cyclic cleaning before the non-metal cleaning (S103).

As the cleaning gas in the metal cleaning (S102), a mixed gas of a $BCl_3$ gas and a $Cl_2$ gas which is a mixed gas described above of a boron-containing gas and a chlorine-containing gas effective for reducing an oxide or a fluoride, or a mixed gas of a $SiCl_4$ gas and a $Cl_2$ gas which is a mixed gas of a silicon-containing gas and a chlorine-containing gas effective for reducing an oxide or a fluoride may be preferably used. These gas systems can also be removed with metal on the electrically floated surface of the processing chamber.

As the cleaning gas in the non-metal cleaning (S203), the fluorine-containing gas, the oxygen-containing gas, or a mixed gas thereof (a mixed gas of a fluorine-containing gas and an oxygen-containing gas) is used. An example thereof is a $SF_6$ gas, a $NF_3$ gas, a mixed gas of a $SF_6$ gas and an $O_2$ gas, or an $O_2$ gas. However, it should be noted that although the fluorine-containing gas is effective for removing either C or Si, the oxygen-containing gas is effective only for removing C depositions. For this reason, it is necessary to selectively use non-metal cleaning gas types according to the type of mixed depositions.

FIG. 1(b) illustrates an FTIR spectrum after executing the plasma processing illustrated in FIG. 1(a). As illustrated in FIG. 2(b), Al-based, Si-based and C-based peaks are not observed, and it is confirmed that the surface of the processing chamber is in a clean state. Therefore, by performing the plasma processing of the present embodiment as illustrated in FIG. 1(a), there is a sufficient removal effect for complicated mixed depositions of C and Al. In the present embodiment, the metal cleaning (S102) and the non-metal cleaning (S103) are repeated five times, but the number of times of repetition is set in consideration of the thickness of the mixed deposition and the like.

As described above, in the case where the mixed depositions are formed in a laminated state, cleaning is stopped in either the C layer or the Al layer only by sequentially executing the metal cleaning and the non-metal cleaning one at a time. From this, it is necessary to repeat the metal cleaning for removing Al and the non-metal cleaning for removing C at least twice in order to deal with mixed depositions. Therefore, in the cyclic cleaning of the present embodiment, at least two cycles are performed.

As described above, according to the present embodiment, the metal cleaning and the non-metal cleaning are cyclically repeated a plurality of times after the etching processing of the wafer, and thus it is possible to remove the metal and the non-metal generated by the etching processing of the wafer alternately little by little, that is, the depositions exposed on the surface. In other words, by repeating the etching step for removing the metal and the non-metal alternately and substantially one layer at a time, it is possible to remove the complex deposition that is deposited complicatedly. As a result, it is possible to reduce the number of particle and defects caused by the complex deposition and to perform mass production processing over a long period of time. Further, since metal cleaning is performed prior to non-metal cleaning, it is possible to prevent change of metal to substances which is hardly removed, and it is possible to reduce residue of metal depositions after removal of complex depositions.

In the present embodiment, the product etching in step 101 is performed on one lot (for example, every 25 wafers) and then the cyclic cleaning is performed. However, regarding the timing of execution of the cyclic cleaning, the product etching step S101 may be set for each wafer, or may be set for every plural wafers or plural lots.

In the present embodiment, non-metal cleaning is performed after the metal cleaning in order to avoid changing to a substance which is hardly removed by fluorination or oxidation of metal. However, in the present invention, the non-metal cleaning is not necessarily performed after the metal cleaning. This is because, in the metal cleaning of the present embodiment, by using a boron-containing gas effective for reduction of an oxide or a fluoride, or a silicon-containing gas effective for reduction of an oxide or a fluoride, a fluoride of metal or an oxide of metal can be removed. Therefore, as cyclic cleaning according to the present invention, non-metal cleaning may be performed before metal cleaning. In this case, for example, it is more effective when there are many non-metal depositions.

Furthermore, it is undesirable that high-energy ions are present during cyclic cleaning. This is because undesirable etching (damage) occurs on the surface of the sample stage 102 and the earth 110. This is a cause of generation of particle due to the etching object of the sample stage 102 and the earth 110. Therefore, it is desirable that the cyclic cleaning is chemical cleaning, and it is desirable that the RF bias applied to the sample stage 102 is as low as possible (0 W is more preferable).

Further, in the present embodiment, the metal cleaning (S102) and the non-metal cleaning (S103) are executed without placing the wafer (dummy wafer) on the sample stage 102. However, a chlorine-containing gas used in the metal cleaning slightly etches the surface of the sample stage 102 containing Al, it is desirable that a dummy wafer such as Si is placed on the sample stage 102 and cyclic cleaning is executed.

Next, a second embodiment of the present invention will be described with reference to FIG. 3. The present embodiment is a plasma processing method capable of further reducing the process fluctuation based on the above-described first embodiment.

Example 2

FIG. 3 is a diagram illustrating a flow of plasma processing. As illustrated in FIG. 3, etching processing of the product wafer is performed in step S301, and then in step S302, metal cleaning is performed. Subsequently, in step S303, the boron deposition is removed using plasma of a $Cl_2$ gas. Next, in step S304, non-metal cleaning is performed. Further, in step S305, fluorine on the surface of the processing chamber is removed by plasma of an $O_2$ gas. Thereafter, steps S302, S303, S304 and S305 are sequentially repeated until the mixed deposition is removed.

Incidentally, the metal cleaning (S302) is the same as the metal cleaning (S102) illustrated in FIG. 1(a), and a description thereof will be omitted. In addition, the non-metal cleaning (S304) is the same as the non-metal cleaning (S103) illustrated in FIG. 1(a), and a description thereof will be omitted. Technical significance of adding a boron deposition removing step (S303) between the metal cleaning (S302) and the non-metal cleaning (S304) in the present embodiment is as follows.

In the metal cleaning (S302), when a mixed gas of a $BCl_3$ gas and a $Cl_2$ gas is used, oxidized metal and nitrided metal deposited in the processing chamber is generated by bonding oxygen and nitrogen in the processing chamber to B. As a boron compound, $BO_xCl_y$ and $BN_xCl_y$ are used. Since these boron compounds have high binding energy and low volatility, the compounds are easily deposited and remain on the surface of the processing chamber. For this reason, it is necessary to remove such a boron compound by the boron deposition removing step (S303). Further, by the boron deposition removing step (S303), the metal deposition covered with the boron deposition is easily removed in the next metal cleaning step (S302).

Next, technical significance of adding the step (S305) of removing fluorine after non-metal cleaning (S304) will be described. In the case of using a fluorine-containing gas in non-metal cleaning (S304), fluorine remains on the surface of the quartz component or the like in the processing chamber. This is because the binding energy of Si and F is high. As fluorination of quartz progresses, it becomes $SiF_4$ and volatilizes, but the quartz surface in which reaction does not completely proceed at the end of non-metal cleaning (S304) becomes $SiO_xF_y$. In this state, in a case where cyclic cleaning in which steps S302, S303 and S304 are sequentially repeated is performed, fluorination of the wafer surface is caused by fluorine remaining on the surface of the quartz component or the like when the product wafer of the next lot is etched, problems of unexpected process fluctuations such as etching stop or particle may occur. Therefore, in order to remove such residual fluorine, removal (S305) of residual fluorine for removing fluorine on the surface of the processing chamber by using plasma of an $O_2$ gas is executed.

As described above, according to the present embodiment, by adding step S303 for removing boron compounds in the processing chamber and step S305 for removing residual fluorine on the surface of the processing chamber, boron and fluorine which may remain in the middle of cleaning can be removed, further the embodiment is effective for reducing the process fluctuation and reducing particle, and mass production processing can be stably performed.

Further, in the present embodiment, since it is possible to avoid a change to a substance hardly removed by fluorination or oxidation of the metal, the non-metal cleaning is performed after the metal cleaning. However, in the present invention, the non-metal cleaning is not necessarily performed after the metal cleaning. This is because, in the metal cleaning of the present embodiment, by using a boron-containing gas effective for reduction of an oxide or a fluoride, or a silicon-containing gas effective for reduction of an oxide or a fluoride, a fluoride of metal or an oxide of metal can be removed. Therefore, as cyclic cleaning according to the present invention, non-metal cleaning may be executed before metal cleaning. Further, the timing of execution of the cyclic cleaning described in the present embodiment may be set for each sheet or for each lot (for example, every 25 wafers) in product etching in the product etching processing step S301 of the wafer.

Next, in the case where a stainless steel earth is used as the earth 110, it is very important for mass production stability not to scrape stainless steel as much as possible. This is because the scraping amount of stainless steel is correlated with the amount of stainless steel-based particle generated. However, when a chlorine-containing gas is used in the metal cleaning described in the first and second embodiments, there is a possibility of corroding and etching by chloritizing the stainless steel. The cause of rust of stainless steel is mainly corrosion and oxidation reaction of the passive film by chloridation.

From the above, when a stainless steel is used as the surface material in the processing chamber, a plasma processing method capable of preventing scraping of stainless steel or the like will be described below.

Embodiment 3

FIG. 4 is a flowchart of the plasma processing of the present embodiment. As illustrated in FIG. 4, product etching is performed in step S401, and next in step S402, plasma processing using a $H_2$ gas or a $SF_6$ gas is executed. Subsequently, in step S403, metal cleaning is executed, and in step S404, boron depositions are removed using plasma of a $Cl_2$ gas. Next, in step S405, non-metal cleaning is executed. Further, in step S406, fluorine on the surface of the processing chamber is removed by plasma of an $O_2$ gas. Thereafter, S402, S403, S404, S405 and S406 are sequentially repeated until the mixed deposition is removed.

Since the metal cleaning (S403), the boron removal (S404), the non-metal cleaning (S405) and the fluorine removal (S406) are the same as the metal cleaning (S302), the boron removal (S303), the non-metal cleaning (S304) and the fluorine removal (S305), respectively, descriptions of the metal cleaning (S403), the boron removal (S404), the non-metal cleaning (S405) and the fluorine removal (S406) will not be omitted.

By performing the plasma processing as described above, it is possible to reduce the scraping amount of the stainless steel during the metal cleaning (S403), and mass production processing can be stably performed with a reduced amount of particle. Next, the reason why the gas used in S402 is a $H_2$ gas or a $SF_6$ gas will be described.

FIG. 5 is a flowchart for evaluating the scraping amount of stainless steel. As illustrated in FIG. 5, in step S501, a stainless steel treatment is executed. Subsequently, in step S502, metal cleaning is executed. After the metal cleaning (S502), the scraping amount of the stainless steel component is measured with a scanning electron microscope. As a gas for generating plasma to be used for stainless steel treatment, an $O_2$ gas, a $SF_6$ gas, a $CF_4$ gas, a $NF_3$ gas, a mixed gas of a $BCl_3$ gas and a $Cl_2$ gas, a mixed gas of a $CF_4$ gas and an $O_2$ gas, a mixed gas of a $SF_6$ gas and an $O_2$ gas, a $N_2$ gas, a $H_2$ gas, a mixed gas of a $SF_6$ gas and a $H_2$ gas, a HBr gas, an Ar gas are sequentially evaluated one by one. Also, since the metal cleaning (S502) is the same as the metal cleaning (S102) illustrated in FIG. 1(a), a description thereof will be omitted.

FIG. 6 is a graph illustrating the relationship between the type of treatment plasma and the etching amount of stainless steel. As illustrated in FIG. 6, when treatment is not executed, the scraping amount is about 7 nm, whereas the scraping amount of stainless steel is substantially increased (worsened) in a case of a gas other than a $SF_6$ gas or a $H_2$ gas. On the other hand, in the case of stainless steel treatment with a $SF_6$ gas or a $H_2$ gas, the scraping amount is reduced to only 2 nm.

It is known that in the mechanism of scraping of stainless steel, a passive film which is a chromium oxide formed on a stainless steel surface, is volatilized as chromyl chloride with oxygen. Therefore, in order to prevent scraping of stainless steel, prevention of conversion of the passive film of stainless steel into chromyl chloride is considered to be effective, and it is estimated that the reduction effect of hydrogen is exerted by removing oxygen from stainless steel due to the plasma of a $SF_6$ gas or a $H_2$ gas. From such a result, it is suitable to use plasma by a $H_2$ gas or plasma by a $SF_6$ gas for stainless steel treatment (S602).

Although the present embodiment has been described with the plasma processing method as illustrated in FIG. 4, the boron removing step (S404) and the fluorine removing step (S406) are not necessarily required (for example, even if boron or fluorine remains, the sensitivity to the product process is low). Therefore, even if the stainless steel treatment is also applied to the plasma processing method illustrated in FIG. 1(a), the same effect as in the present embodiment can be obtained. A specific flow may be a flow in which stainless steel treatment is executed before metal cleaning (S102), and stainless steel treatment, metal cleaning (S102), non-metal cleaning (S103) are sequentially repeated.

Furthermore, in the present embodiment, in order to prevent the metal from changing to a substance hardly removed by fluorination or oxidation, the non-metal cleaning is performed after the metal cleaning, but the non-metal cleaning is not necessarily performed after the metal cleaning. This is because, in the metal cleaning of the present embodiment, by using a boron-containing gas effective for reduction of an oxide or a fluoride or a silicon-containing gas effective for reduction of an oxide or a fluoride, a fluoride of metal or an oxide of metal can be removed. Therefore, as cyclic cleaning according to the present invention, non-metal cleaning may be performed before metal cleaning.

Further, if the stainless steel treatment is executed before the metal cleaning as illustrated in FIG. 5, the same effect as in the present embodiment can be obtained. Therefore, in the invention according to the present embodiment, it is preferable to execute the stainless steel treatment before the metal cleaning, and the order with respect to the other steps is not limited at all. In other words, the invention according to the present embodiment is a plasma processing method for plasma-etching a sample in a processing chamber in which a member of which material is stainless steel is disposed on the surface, including a treatment step of plasma-processing using a $H_2$ gas or a $SF_6$ gas, and a metal removing step of removing the deposited film containing a metal element by using the plasma after the treatment step.

Next, in the cyclic cleaning in which the metal cleaning and the non-metal cleaning are repeated a plurality of times as in the above-described Embodiments 1 to 3, a method of determining the number of repeating times of cleaning using the emission of the plasma will be described below with reference to FIGS. 7 to 9.

Embodiment 4

FIG. 7 is a flowchart of a plasma processing method for determining the number of times of cyclic cleaning by using emission of plasma.

As illustrated in FIG. 7, etching of the product wafer is performed in step S701, and then metal cleaning is executed in step S702. Subsequently, in step S703, boron depositions are removed using plasma of $Cl_2$ gas plasma. Next, in step S704, non-metal cleaning is executed. Further, in step S705, fluorine on the surface of the processing chamber is removed by plasma of an $O_2$ gas. Thereafter, steps S702, S703, S704, and S705 are sequentially repeated until the mixed deposition is removed.

The metal cleaning (S702) is the same as the metal cleaning (S102) illustrated in FIG. 1(a), and a description thereof will be omitted. In addition, the non-metal cleaning (S704) is the same as the non-metal cleaning (S103) illustrated in FIG. 1(a), and a description thereof will be omitted. Furthermore, the boron deposition removing step (S703) is the same as the boron deposition removing step (S303) illustrated in FIG. 3, and a description thereof will be omitted. In addition, the step (S705) of removing fluorine is the same as the step (S305) of removing fluorine illustrated in FIG. 3, and a description thereof will be omitted.

Next, in step S706, it is determined whether or not both the plasma emission intensity corresponding to the metal-containing deposition removed in the metal cleaning (S702) and the plasma emission intensity corresponding to the non-metal-containing deposition removed in the non-metal cleaning (S704) is substantially 0. If the plasma emission intensity corresponding to the metal-containing deposition and the plasma emission intensity corresponding to the non-metal-containing deposition are substantially 0, the next processing (S707) is performed. If the plasma emission intensity corresponding to the metal-containing deposition or the plasma emission intensity corresponding to the non-metal-containing deposition is not 0, the metal cleaning (S702), the boron removal (S703), the non-metal cleaning (S704), and the fluorine removal (S705) are sequentially executed and the determination is made in step S706. However, the determination in step S706 is performed after steps S702, S703, S704, and S705 are sequentially repeated twice.

In the plasma processing illustrated in FIG. 7, for example, when the reaction products are an Al-based reaction product and a C-based reaction product, the metal cleaning (S702), the boron removal (S703), the non-metal cleaning (S704) and the fluorine removal (S705) are sequentially repeated until both the Al emission intensity and the C emission intensity become substantially zero.

Measurement of the plasma emission intensity corresponding to metal-containing depositions and non-metal-containing depositions may be performed after the metal cleaning (S702) and the non-metal cleaning (S704) in real time, or may be performed in real time respectively during the metal cleaning (S702) and the non-metal cleaning (S704) in real time. In order to detect the end point of the emission intensity of the metal cleaning (S702) and the non-metal cleaning (S704) in real time, there is a method of monitoring the difference between the current emission intensity and the emission intensity of the previous cycle. Then, when the difference value becomes substantially 0, the emission intensity at the stage may be a saturation point (end point).

Even when the emission intensity is measured at any timing, the metal cleaning (S702) or the like is performed again in the step of S706 or the next processing (S707) is determined.

Further, until all the difference values of the emission intensities of the Al, Ti and Ta atoms or molecules in the metal cleaning (S702) satisfy 0 and all the difference values of the emission intensities of Si and C atoms or molecules in the non-metal cleaning (S704) satisfy 0, the cycle in which the metal cleaning (S702), the boron removal (S703), the non-metal cleaning (S704), and the fluorine removal (S705) may be sequentially repeated may continue. By adopting such a method, it is possible to remove complicated reaction products generated from wafers and introduced gases without remaining. Incidentally, the phrase "the difference value substantially satisfies 0" used here strictly means that the value becomes equal to or less than a threshold value when a value obtained by combining "the absolute value of the difference value" with the maximum amount of CCD noise of the spectrometer and the maximum amount of plasma fluctuation is set as the threshold value.

In other words, when N is a natural number, and the absolute value of the difference between the emission intensity monitored in the N-th metal removing step and the emission intensity monitored in the (N−1)-th metal removing step is equal to or less than a predetermined value, the metal removing step is completed.

Then, when M is a natural number, and the absolute value of the difference between the emission intensity monitored in the M-th non-metal removing step and the emission intensity monitored in the (M−1)-th non-metal removing step is equal to or less than a predetermined value, the non-metal removing step is completed and thus it is possible to determine the completion of the cyclic cleaning.

Next, referring to FIG. 8, a specific example of determining the completion of the cyclic cleaning in which the metal cleaning (S702), the boron removal (S703), the non-metal cleaning (S704) and the fluorine removal (S705) are sequentially repeated will be described. FIG. 8 illustrates the relationship between the emission intensity during cyclic cleaning and the cycle number of cyclic cleaning. The vertical axis illustrates the emission intensity (wavelength of 394 nm) of Al atoms during the metal cleaning (S702) and the emission intensity (wavelength of 440 nm) of SiF molecules during the non-metal cleaning (S704) in arbitrary units. The change in the emission intensity of the Al atom is related to the change in the deposition of the reaction product generated in the product etching (S701) in the processing chamber. In addition, the change in the emission intensity of the SiF molecules is related to the change in the quartz area of the surface member in the processing chamber (SiF emission intensity decreases as the metal-containing deposition on the quartz surface increases) and the change in the Si deposition.

As illustrated in FIG. 8, the emission intensity of the Al atom decreases with an increase in the cycle number and saturated at a cycle number of 4. Saturation of the emission intensity of these Al atoms and saturation of the emission intensity of SiF molecules means that depositions in the processing chamber have been removed. Therefore, cyclic cleaning may be completed at the cycle number of 4 or later.

Next, with reference to FIG. 9, a method of detecting the end point of the emission intensity with higher accuracy will be described. FIG. 9 illustrates the emission spectrum during the metal cleaning (S702). "Initial" in FIG. 9 is the spectrum at the first cycle of the cyclic cleaning, and the "last" in FIG. 9 is the spectrum at the fifth cycle of the cyclic cleaning. The emission intensity of the Al atom is observed at wavelengths 394 nm and 396 nm. On the other hand, the emission intensity varies even in the wavelength range shorter than 391 nm. This is a change component of plasma which is not related to the emission of Al, and is a so-called noise component. It is considered that the noise component is also superimposed on the Al at the wavelengths 394 nm and 396 nm and has an influence. For this reason, it is more desirable to use a difference value $(I_{394nm}-I_{391nm})$ or a division value $(I_{394nm}/I_{391nm})$ rather than using only the emission intensity $I_{394\ nm}$ of the Al atom, as the emission to be monitored.

This is true not only for the Al emission intensity but also for Ti and Ta. For example, in a case where the wavelength of Ti is 399 nm, the difference value or the division value of the background intensity of 402 nm in the vicinity may be used. By using a value obtained by subtracting or dividing at a wavelength in the vicinity of the target wavelength, it is possible to exclude emission change of atoms other than the target atom. As a result, the erroneous determination of automatic termination of the number of times of cyclic cleaning can be prevented. Here, the vicinity means a range of ±10 nm around the target wavelength.

In other words, as the emission intensity monitored in the metal removing step, a difference value between the emission intensity of the peak wavelength of atoms or molecules and the background emission intensity within the predetermined range of the peak wavelength, or a value obtained by dividing the emission intensity of the peak wavelength by the background emission intensity within the predetermined range of the peak wavelength is used. In addition, as the emission intensity monitored in the non-metal removing step, the difference value between the emission intensity of the peak wavelength of atoms or molecules and the emission intensity of the background within the predetermined range of the peak wavelength, or a value obtained by dividing the emission intensity of the peak wavelength by the emission intensity of the background within the predetermined range of the peak wavelength is used, and thus it is possible to detect the end point of the emission intensity with higher accuracy.

As a method of detecting the residual metal, in the case of Al, not only the emission intensity of the Al atom but also the emission intensity of the AlCl molecule can be used. Similarly, for the detection method of Ti, in addition to the emission intensity of Ti atoms, the emission intensity of TiCl molecules can also be used. As for Ta, the emission intensity of TaCl molecule can also be used in addition to the emission intensity of Ta atoms. In addition, Cl and BCl emission intensities which are these etching radicals may be used. As the method of detecting residual non-metal, emission intensities of Si, SiF, $C_2$, $CF_x$, CO, CN, CS, CH and F and O which are etching radicals may be used.

Although the present embodiment has been described with the plasma processing method as illustrated in FIG. 7, the boron removing step (S703) and the fluorine removing step (S705) are not necessarily required (for example, the reason is that sensitivity to the product process is small even if boron or fluorine remains). Therefore, even if step S706 is also applied to the plasma processing method illustrated in FIG. 1(a), the same effect as in the present embodiment can be obtained.

A specific flow is as follows, when step S706 is performed after the non-metal cleaning (S103) and the plasma emission intensity corresponding to the metal-containing deposition and the plasma emission intensity corresponding to the non-metal-containing deposition are substantially 0, the next processing (S707) is performed, and when the plasma emission intensity corresponding to the metal-containing deposition or the plasma emission intensity corresponding to the non-metal-containing deposition is not 0, the metal cleaning (S102) and the non-metal cleaning (S103) are sequentially repeated.

Furthermore, in the present embodiment, the non-metal cleaning is performed after the metal cleaning in order to avoid a change to a substance hardly removed by fluorination or oxidation of the metal. However, in the present invention, the non-metal cleaning is not necessarily performed after the metal cleaning. This is because, in the metal cleaning of the present embodiment, by using a boron-containing gas effective for reduction of an oxide or a fluoride or a silicon-containing gas effective for reduction of an oxide or a fluoride, a fluoride of metal or an oxide of metal can be removed. Therefore, as cyclic cleaning according to the present invention, the non-metal cleaning may be executed before the metal cleaning.

In the present embodiment, in step S706, it is determined whether or not both the plasma emission intensity corresponding to the metal-containing deposition and the plasma emission intensity corresponding to the non-metal-containing deposition are substantially 0. However, as a plasma processing method according to the present invention, the determination is not necessarily made in step S706. For example, in the metal cleaning (S702), it is determined whether or not the plasma emission intensity corresponding to the metal-containing deposition is substantially 0, and in the non-metal cleaning (S704), it is determined whether or not the plasma emission intensity corresponding to the non-metal containing deposition is substantially 0, and cyclic cleaning may be completed when the plasma emission intensity corresponding to the metal-containing deposition and the plasma emission intensity corresponding to the non-metal-containing deposition are substantially zero.

As described above, the cycle number of the cyclic cleaning according to the present invention can be automatically determined by using the change in the emission intensity during the metal cleaning and the non-metal cleaning, and it is possible to stably perform mass production processing by reducing the process fluctuation or the particle due to metal or non-metal.

Next, the Fault Detection and Classification (FDC) technique related to the cyclic cleaning operation system described in the first to fourth embodiments will be described.

Embodiment 5

As described in the fourth embodiment, it is ideal that the cycle number of cyclic cleaning is automatically determined using a change in emission intensity or the like. However, in some cases, the cycle number is set in advance by a device administrator and an operation method for determining whether cleaning is sufficient or insufficient as a result is desirable. Specifically, in some cases, the device administrator sets the cycle number, when the cycle number is not proper, a warning on the screen of the computer is issued, or the subsequent processing is stopped. In other words, an auxiliary function to the insufficient cycle number is added.

FIG. 10 is a determination flow for performing the warning display or the interruption of the plasma processing with respect to the insufficient cycle number of the cyclic cleaning. As illustrated in FIG. 10, product etching is performed in step S1001, and then metal cleaning is executed in step S1002. Subsequently, in step S1003, the boron deposition is removed using plasma of a $Cl_2$ gas. Next, in step S1004, non-metal cleaning is executed. Further, in step S1005, fluorine on the surface of the processing chamber is removed by plasma of an $O_2$ gas. Thereafter, steps S1002, S1003, S1004 and S1005 are sequentially repeated until the mixed deposition is removed.

Incidentally, the metal cleaning (S1002) is the same as the metal cleaning (S102) illustrated in FIG. 1(a), and a description thereof will be omitted. In addition, the non-metal cleaning (S1004) is the same as the non-metal cleaning (S103) illustrated in FIG. 1(a), and a description thereof will be omitted. Furthermore, the boron deposition removing step (S1003) is the same as the boron deposition removing step (S303) illustrated in FIG. 3, and a description thereof will be omitted. In addition, the step (S1005) of removing fluorine is the same as the step (S305) of removing fluorine illustrated in FIG. 3, and a description thereof will be omitted.

Next, in step S1006, it is determined whether or not to reach the set cycle number set by the device administrator, and if the cycle number does not reach the set number cycles, the metal cleaning (S1002), the boron removal (S1003), the non-metal cleaning (S1004) and the fluorine removal (S1005) are sequentially executed.

In step S1006, it is determined whether or not to reach the set cycle number set by the device administrator, and if the cycle number reaches the set cycle number, it is determined whether or not both the difference value of the emission intensity of metal (Al) and the difference value of the emission intensity of non-metal (SiF) are substantially 0 in S1007. If the difference value of the emission intensity of the metal (Al) of the metal cleaning (S1002) or the difference value of the emission intensity of the non-metal (SiF) of the non-metal cleaning (S1004) is substantially 0, the next processing (S1008) is performed. Then, when the difference value of the emission intensity of the metal (Al) of the metal cleaning (S1002) or the difference value of the emission intensity of the non-metal (SiF) of the non-metal cleaning (S1004) is not substantially 0, in S1009, the warning display on the screen of the computer or the warning display and the interruption of processing are performed.

Further, at the same time as the interruption of the processing, for example, a screen for allowing the device administrator to select whether or not to continue the processing is displayed on the screen of the computer, and in accordance with an instruction from the device administrator, for example, the next processing (S1008) such as the next lot processing is performed, or the interruption of the processing without change may be selected. Further, in the present embodiment, a flow for performing the warning display and the interruption of the processing is described in the example using the difference value of the emission intensity of Al and the difference value of the emission intensity of SiF, but in the present embodiment, is not limited to the reaction products of Al and Si as described in Embodiment 4. If Embodiment 4 is applied, the warning display or the warning display and the interruption of processing can also be performed on complicated mixed depositions of metal such as Al, Ti and Ta and non-metal such as Si, C and B.

Although the present embodiment has been described with the plasma processing method as illustrated in FIG. 10, the boron removing step (S1003) and the fluorine removing step (S1005) are not necessarily required (for example, the reason is that sensitivity to the product process is small even if boron or fluorine remains). Therefore, even if the cyclic cleaning of the present embodiment is replaced by the cyclic cleaning illustrated in FIG. 1(a), the same effect as in the present embodiment can be obtained.

Furthermore, in the present embodiment, the non-metal cleaning is performed after the metal cleaning in order to avoid a change to a substance hardly removed by fluorination or oxidation of metal. However, in the present invention, the non-metal cleaning is not necessarily performed after the metal cleaning. This is because, in the metal cleaning of the present embodiment, by using a boron-containing gas effective for reduction of an oxide or a fluoride or a silicon-containing gas effective for reduction of an oxide or a fluoride, a fluoride of metal or an oxide of metal can be removed. Therefore, as cyclic cleaning according to the present invention, the non-metal cleaning may be executed before the metal cleaning.

Embodiment 6

As described in Embodiment 4, the cycle number of the cyclic cleaning can be determined by a method of monitoring the difference between the emission intensity of the current cycle and the emission intensity of the previous cycle. However, there are cases where an appropriate end point cannot be detected only by the method of Embodiment 4. In the present embodiment, an example thereof and an appropriate end point determination method thereof will be described.

FIG. 15 is a flowchart illustrating an improved end point determination method for cyclic cleaning. Only the end point determination method S1506 is different from FIG. 7 described in Embodiment 4. The case where the present end point determination method is required is a case where the amount of laminated depositions of metal and non-metal is large. Hereinafter, referring to FIGS. 16 to 18, one example of cyclic cleaning in a case where the deposition amount of metal is large in the product etching (S701) will be described with reference to the relationship between emission and the surface state of the processing chamber.

FIG. 16 illustrates the relationship between the Al emission intensity and the CS emission intensity and the cycle number when cyclic cleaning is executed on the mixed deposition in which Al and C are laminated, and FIG. 17 illustrates the relationship between the Al difference intensity and CS difference intensity and the cycle number. Here, the difference intensity is the difference between the emission intensity of the current cycle and the emission intensity of the previous cycle. The Al emission intensity uses the division value $I_{394nm}/I_{391\ nm}$ and the CS emission intensity uses the division value $I_{258nm}/I_{250nm}$. The Al emission intensity is related to the removal amount of the Al deposition during the metal cleaning (S702), and the CS emission intensity is related to the removal amount of the C deposition during the non-metal cleaning (S704) (CS is generated by the reaction between the $SF_6$ plasma and the C deposition). A cycle in which both difference intensities of Al and CS emission are substantially 0 is a candidate for the end point. However, as apparent from FIG. 17, there are two timings at which the difference intensity becomes substantially 0, that is, the time point of cycle n and the time point of n+3.

On the other hand, FIG. 18 is an estimation diagram of the surface state of the processing chamber in each cycle of the cyclic cleaning. In the cycle n-4, the outermost surface layer viewed from the plasma is a C deposition, and the Al deposition and the wall surface of the processing chamber are located in an inner part thereof. In FIG. 16, first, in the cycle n-4, the C deposition on the outermost surface is removed, and thus the CS emission intensity has increased. In cycle n-1, removal of C deposition has been completed, but removal of the Al layer has peaked.

In the next cycle n, the thickness of the Al deposition decreases, but the surface area of Al in terms of the issuing intensity of the plasma illustrates the same state as the cycle n-1. Therefore, the Al emission intensities of cycles n-1 and n during the metal cleaning are substantially the same, and in FIG. 17, the difference intensity of n is substantially 0. However, as illustrated in the schematic diagram, the time point of cycle n is not a true end point. Therefore, there is a case where the erroneous determination may be caused only by a method in which the point where the difference intensity becomes substantially 0 is set as the end point. In order to avoid this, only a case where the difference intensity of Al is substantially 0 and the Al emission intensity is equal to or less than a certain threshold value is set as the end point at each time point of the cycle.

That is, a case where X and Y are natural numbers, the absolute value of the difference between the emission intensity monitored in the X-th metal removing step and the emission intensity monitored in the (X−1)-th metal removing step is equal to or less than a first predetermined value (including being substantially 0), and the emission intensity monitored in the X-th metal removing step is equal to or less than a second predetermined value (numerical value set as the threshold value) is set as a first requirement, and when the first requirement is satisfied Y times, the metal removing step is determined to be completed.

Then, a case where x and y are natural numbers, the absolute value of the difference between the emission intensity monitored in the x-th non-metal removing step and the emission intensity monitored in the (x−1)-th non-metal removing step is equal to or less than a third predetermined value (including being substantially 0) or less and the emission intensity monitored in the x-th non-metal removing step is equal to or less than a fourth predetermined value (numerical value set as a threshold value) is set as a second requirement, and when the second requirement is satisfied y times, the non-metal removing step is determined to be completed, and thus it is possible to detect the end point of removal of the deposition with high accuracy.

However, the notations of X-th, (X−1)-th, x-th and (x−1)-th indicate consecutive steps, and X and x do not mean one fixed numerical value.

Specifically, if Y is 2, in the case where the first requirement is satisfied in the third and fourth metal removing steps and the first requirement is satisfied again in the seventh and eighth metal removing steps, the metal removing step is determined to be completed. That is, in this example, X can be 4 or 8.

Furthermore, as another end point detection method, when X and Y are natural numbers and the following conditions (1) and (2) are satisfied, the metal removing step is determined to be completed.

(1) A case where the absolute value of the difference between the emission intensity monitored in the X-th metal removing step and the emission intensity monitored in the (X−1)-th metal removing step is equal to or less than the first predetermined value (including being substantially 0) is satisfied Y times.

(2) When the emission intensity monitored in the X-th metal removing step when the first predetermined value is satisfied Y times in the above (1) is equal to or less than the second predetermined value (numerical value set as a threshold value).

Then, when x and y are natural numbers and the following conditions (3) and (4) are satisfied, the non-metal removing step is determined to be completed.

(3) a case where the absolute value of the difference between the emission intensity monitored in the x-th non-metal removing step and the emission intensity monitored in the (x−1)-th non-metal removing step is equal to or less than the third predetermined value (including being substantially 0) is satisfied y times.

(4) The emission intensity monitored in the x-th non-metal removing step is equal to or less than the fourth predetermined value (numerical value set as a threshold value).

However, the notations of X-th, (X−1)-th, x-th, and (x−1)-th indicate consecutive steps, and X and x do not mean one fixed numerical value.

Specifically, if Y is 2, when in the third and fourth metal removing steps and the seventh and eighth metal removing steps, the absolute value of the difference between the emission intensities satisfies the first predetermined value and the emission intensity monitored in the eighth metal removing step is equal to or less than the second predetermined value, the metal removing step is determined to be completed. That is, in this example, X can be 4 or 8.

In the example of the Al of the present embodiment illustrated in FIG. 16, for example, the threshold value can be set between 1.9 and 1.1. This value depends on the density or the transition probability of the emission species, the plasma electron temperature, the detection sensitivity of the spectrometer, the exposure time, and the like. Also, the Al emission at the time point of cycle n is easily detected because the intensity is strong due to the large amount of Al remaining in the chamber. Therefore, instead of the method of preventing the erroneous determination by using the threshold value of emission intensity, a method of setting only a case where the emission peak is not detected as the end point may be used.

As a method of detecting the emission peak, a Voigt function obtained by superimposing a Gaussian function and a Lorentz function is appropriate, and a Voigt function or a Long Normal function suitable for detection of a long period spectrum is used for the estimation of the background spectrum. FIG. 19 illustrates an example of Al peak detection using the Voigt function. The background spectrum is also fitted by Voigt function and two Al emission peaks at 396 nm (Al peak fit (1)) and 394 nm (Al peak fit (2)) are extracted from the emission spectrum. Parameters such as peak wavelength and half-width are required for fitting parameters, but parameters of peak wavelength and half-width can be determined in advance at the development stage, and only intensity can be set arbitrarily. Alternatively, these values may be determined from literature values of emission or resolution specifications of the spectrometer.

In the present embodiment, an example is illustrated in which the metal deposition is Al and the non-metal deposition is C, but even if the metal deposition is Ti, Ta or the like, and the non-metal deposition is Si, B, NH or the like, by choosing an appropriate emission wavelength corresponding to the removal of the deposition, an appropriate end point determination can be performed using the same end point determination method. In the present embodiment, the method of acquiring the emission intensity data during the metal cleaning and the non-metal cleaning is not mentioned, but a method using the total time average during each processing or a method using some time average may be used. Particularly immediately after the plasma ignition, emission fluctuation caused by unstable plasma and pressure is measured, and thus the time period may be excluded. As a standard of the exclusion time, around 0.5 seconds to 5 seconds is appropriate.

Further, in the present embodiment, an appropriate determination method in the case where the metal deposition layer is thick has been described, the appropriate determination is necessary even in the case where the non-metal deposition is thick. For this reason, it is necessary to apply the same determination method (ending point only when the emission intensity is equal to or less than a certain threshold value in addition to the difference intensity of substantially 0) to non-metal. That is, in each cycle, only when the difference intensity of the emission intensity due to the removal of the deposition in the metal is substantially 0, and the emission intensity is equal to or less than a certain threshold value, the end point of the metal is set, and only when the difference intensity of the emission intensity due to the removal of the deposition in the non-metal is substantially 0, and the emission intensity is equal to or less than a certain threshold value, the end point of non-metal is set and the cycle where both end points of the metal and the non-metal are detected is the true end point. In addition, although plasma spectroscopy is used to detect depositions during cyclic cleaning, several alternative methods for detecting depositions are conceivable. Examples thereof include mass spectroscopy, absorption spectroscopy, laser induced fluorescence spectroscopy, laser scattering and the like. In these cases, it is considered that the end point can be detected using the same method as in the present embodiment.

In one example of the present embodiment and Embodiment 4, the difference intensity being substantially 0 is one of the end point determination conditions. The reason why the difference intensity is used instead of the emission intensity is as follows. In mass production etching equipment, the product processing of semiconductor devices has been repeated over 10,000 wafers and over many years, and thus there are situations where loss and scattering of light in the optical path and aging of the spectrometer cannot be ignored. Moreover, this has a wavelength dependence, and there is a situation where it is difficult to extract only the emission intensity caused by the deposition desired to be truly detect by obstruction of the background spectrum obstructs (for example, the background spectrum measured together with the Al emission spectrum in FIG. 9). Meanwhile, in order to perform highly accurate end point determination with good reproducibility, if a method in which the difference intensity which is the latest light emission change with less influence than the end point determination using the absolute value of the emission intensity is substantially 0 is used, it is possible to determine the end point with high reproducibility.

Further, in the present embodiment, the case where the difference strength of Al is substantially zero and the Al emission intensity is equal to or less than a certain threshold value is set as a condition, when the condition is satisfied once, it is set as the end point, but the time point at the condition is satisfied several times can be set as the end point. By adopting this method, it is possible to stably perform end point determination even when unexpected unstable plasma change occurs.

Embodiment 7

In the present embodiment, the description will be given of a realization method and a composition concerning the speeding up of cyclic cleaning, which improves the operation rate of mass production etching, particularly the improvement of the metal cleaning rate.

In order to realize the speeding up, it is necessary to know the rate-determining portion of the cleaning rate in the processing chamber. Therefore, a test piece (coupon sample) of an alumina wafer simulating a metal depot in the processing chamber is attached inside the processing chamber, and the relationship between the cleaning rate distribution and the metal cleaning condition is investigated. The metal cleaning condition is the $BCl_3/Cl_2$ gas, the microwave power of 800 W and a COIL current value which is the ECR resonance condition, and is set so that the ECR height defined as the distance from the sample stage 102 becomes 20 cm (High) and 15 cm (Low), respectively. Attachment portions of the test piece coupon wafer are three points of the inner cylinder (upper) which is 2 cm from the upper end of the inner cylinder 109, the inner cylinder (middle) which is a center position obtained by bisecting the length of the inner cylinder, and the sample stage 102.

FIG. 20 illustrates distributions of alumina cleaning rates in the inner cylinder (upper), the inner cylinder inner cylinder (middle), and the sample stage 102 in the case of ECR High and Low, respectively. The cleaning rate on the vertical axis is normalized with reference to the inner cylinder (middle) at the time of ECR Low as the maximum rate. When comparing ECR Low and High, the rate of the sample stage or the inner cylinder (middle) at the lower part of the processing chamber is higher at the Low, while the rate of the inner cylinder (upper) is 0. On the other hand, at High, the rate of the inner cylinder (upper) at the upper part of the processing chamber is a finite value. From this, it can be seen that when only one of the conditions is used, it is desirable to execute the metal cleaning at least at the two upper and lower ECR heights because the rate-determining portion occurs at the removal rate of the depositioned film at the upper part and the lower part of the processing chamber.

FIG. 21 is an example of a sequence flow of cyclic cleaning using metal cleaning at two upper and lower ECR heights. The relationship between the ECR height of the metal cleaning (A) (S2002) and the metal cleaning (B) (S2004) may be set to any one of the following values.

ECR height of metal cleaning (A)>ECR height of metal cleaning (B)

ECR height of metal cleaning (A)<ECR height of metal cleaning (B)

In addition, by performing the non-metal cleaning (S2003) after each of the metal cleaning (A) (S2002) and the metal cleaning (B) (S2004), mixed depositions of metal and non-metal are efficiently removed.

Embodiment 8

In the present embodiment, supplementary explanation will be given on Embodiments 1 to 7. In these embodiments, a boron deposition removing step (S303, S404, S703 and S1003) was sometimes introduced for the purpose of removing boron depositions generated during the metal cleaning. However, the melting point of $BF_3$ is about −100° C. at atmospheric pressure and the fluoride of boron is highly volatile. Therefore, there are cases where they can be removed at the same time in the non-metal cleaning step (S304, S405, S704 and S1004) using an F-based gas. For this reason, F-based non-metal cleaning (S304, S405, S704 and S1004) having a function of removing boron depositions may be executed, except for the boron deposition removing step (S303, S404, S703 and S1003). In addition, the non-metal cleaning (S103, S304, S405, S704 and S1004) may be removed by using a plurality of steps effective for removing Si, C, B and NH-based depositions.

For example, there is a two-step structure including Condition 1 effective for Si removal and Condition 2 effective for C removal. For example, Condition 1 may be an F-based gas and Condition 2 may be an O-based gas. This is because it is sometimes possible to realize high speed removal of each deposition by using a plurality of steps. At this time, Condition 1 can also remove B depositions together. Also, after executing the non-metal cleaning step (S304, S405, S704 and S1004), in the condition that the amount of the residual fluorine on the surface of the processing chamber is recognized to be sufficiently small (for example, in a case where residual fluorine is reduced after a sufficient treatment time under treatment conditions of mainly O gas system), the step of removing fluorine (S305, S406, S705 and S1005) may not be executed.

In addition, Embodiments 1 to 6 and 8 have been described with the case where the plasma processing method according to the present invention is applied to a microwave Electron Cyclotron Resonance (ECR) plasma etching apparatus, but even in plasma etching apparatuses using other plasma sources such as capacitively coupled plasma and inductively coupled plasma, it is possible to obtain the same effects as in Embodiments 1 to 6 and 8 of the present invention.

As described above, according to the present invention, it is possible to remove complex depositions of metal such as Al, Ti and Ta and non-metal such as Si, C and B deposited in the processing chamber, and realize long-term mass production processing.

REFERENCE SIGNS LIST

101: wafer
102: sample stage
103: top plate
104: shower plate
105: gas supply device
106: waveguide
107: radio frequency power supply
108: electromagnet
109: inner cylinder
110: earth
111: matching unit
112: radio frequency power supply for applying bias
113: vacuum evacuation valve
114: ATR-FTIR device

The invention claimed is:

1. A plasma processing method for plasma-cleaning a deposited film which contains a metal element and a non-metal element and is deposited in a processing chamber, the method comprising:
   an etching step for plasma-etching a sample;
   a metal removing step of removing a first portion of the deposited film which contains the metal element, by plasma generated by using a mixed gas of a boron-containing gas and a chlorine-containing gas or a mixed gas of a silicon-containing gas and a chlorine-containing gas after the etching step; and
   after the metal removing step, a non-metal removing step of removing a second portion of the deposited film which contains the non-metal element, for a duration which prevents fluorination or oxidation of the metal element, by plasma generated by using a fluorine-containing gas or an oxygen-containing gas after the metal removing step, wherein
   the metal removing step and the non-metal removing step are repeated twice or more to remove carbon from the surface of the sample before a subsequent etching step is performed,
   the surface of the processing chamber is electrically floated, and
   the metal removing step and the non-metal removing step are performed when the sample is placed on a sample stage.

* * * * *